United States Patent
Vaudo et al.

[11] Patent Number: 6,156,581
[45] Date of Patent: Dec. 5, 2000

[54] GAN-BASED DEVICES USING (GA, AL, IN)N BASE LAYERS

[75] Inventors: Robert P. Vaudo, New Milford, Conn.; Joan M. Redwing; Michael A. Tischler, both of Phoenix, Ariz.; Duncan W. Brown, Wilton, Conn.

[73] Assignee: Advanced Technology Materials, Inc., Danbury, Conn.

[21] Appl. No.: 08/984,473

[22] Filed: Dec. 3, 1997

Related U.S. Application Data

[63] Continuation-in-part of application No. 08/894,609, filed as application No. PCT/US96/01724, Feb. 5, 1996, Pat. No. 5,874,747, and application No. 08/188,469, Jan. 27, 1994, Pat. No. 5,679,152
[60] Provisional application No. 60/031,555, Dec. 3, 1996.

[51] Int. Cl.⁷ .................................................. H01L 21/205
[52] U.S. Cl. ............................... 438/22; 438/46; 438/483
[58] Field of Search ................................. 438/46, 22, 48, 438/93, 479, 483, 518, 718, 931, 977, 930; 117/952, 953; 427/248.1, 255.1

[56] References Cited

U.S. PATENT DOCUMENTS

| | | | |
|---|---|---|---|
| 4,144,116 | 3/1979 | Jacob et al. | 156/611 |
| 4,622,093 | 11/1986 | Shih | 147/175 |
| 4,727,047 | 2/1988 | Bozler et al. | 437/89 |
| 4,931,132 | 6/1990 | Aspnes | 117/84 |
| 5,210,051 | 5/1993 | Carter, Jr. . | |
| 5,679,152 | 10/1997 | Tishler et al. | 117/97 |
| 5,777,350 | 7/1998 | Nakamura et al. | 257/96 |
| 5,810,925 | 9/1998 | Tadamoto et al. | 117/90 |
| 5,874,747 | 2/1999 | Redwing et al. | 257/72 |
| 5,923,946 | 7/1999 | Negley | 438/4 |

FOREIGN PATENT DOCUMENTS 62-183399  6/1987  Japan .

OTHER PUBLICATIONS

"Defect reduction in GaAs epitaxial layers using a GaAsP–InGaAs strained layer super lattice," Tischler et al., Appl. Phys. Lett. 46(3), pp. 294–296 (1985).
"GaN, AlN, and InN: A Review," Strite, S., and Markos, J. Vac. Sci. Technol. B 10(4), 137–1266 (1992).
"Current Status of GaN and Related Compounds as Wide–Gap Semiconductors," Matsuoka, T., J. Crystal Growth 124, 433–438 (1992).

*Primary Examiner*—Savitri Mulpuri
*Attorney, Agent, or Firm*—Steven J. Hultquist; Oliver A.M. Zitmann

[57] ABSTRACT

A method of forming a (gallium, aluminum, indium) nitride base layer on a substrate for subsequent fabrication, e.g., by MOCVD or MBE, of a microelectronic device structure thereon. Vapor-phase (Ga, Al, In) chloride is reacted with a vapor-phase nitrogenous compound in the presence of the substrate, to form (Ga, Al, In) nitride. The (Ga, Al, In) nitride base layer is grown on the substrate by HVPE, to yield a microelectronic device base comprising a substrate with the (Ga, Al, In) nitride base layer thereon. The product of such HVPE process comprises a device quality, single crystal crack-free base layer of (Ga, Al, In) N on the substrate, in which the thickness of the base layer may, for example, be on the order of 2 microns and greater and the defect density of the base layer may, for example, be on the order of 1E8 cm$^{-2}$ or lower. Microelectronic devices thereby may be formed on the base layer, over a substrate of a foreign (poor lattice match) material, such as sapphire. Devices which may be fabricated utilizing the HVPE base layer of the invention include light emitting diodes, detectors, transistors, and semiconductor lasers.

62 Claims, 13 Drawing Sheets

GAN-BASED DEVICES USING (GA, AL, IN)N BASE LAYERS

This claims the priority of the following applications: (1) United States Provisional Application Ser. No. 60/031,555 filed Dec. 3, 1996; (2) U.S. patent application Ser. No. 08/188,469 filed Jan. 27, 1994, and issued Oct. 21, 1997 as U.S. Pat. No. 5,679,152, of which this is a continuation-in-part; and (3) U.S. patent application Ser. No. 08/894,609 filed Nov. 24, 1997 as a §371 application based on and claiming priority of International Patent Application No. PCT/US96/0124 filed Feb. 5, 1996, such U.S. patent application Ser. No. 08/894,609 having issued Feb. 23, 1999 as U.S. Pat. No. 5,874,747, of which this is a continuation-in-part.

BACKGROUND OF THE INVENTION

1. Field Of The Invention

The present invention variously relates to (i) a method of forming a (Ga, Al, In) nitride base layer on a substrate for subsequent fabrication of a microelectronic device structure thereon, (ii) to a base structure for such fabrication, including a device quality, single-crystal, crack-free base layer of (Ga, Al, In) nitride on the substrate, in which the thickness of the base layer may, for example, be on the order of 2 microns and greater and the defect density of the base layer may, for example, be on the order of 1E8 cm$^{-2}$ or lower, and (iii) to a device article comprising a device, e.g., a light emitting diode, detector, transistor, filter, semiconductor laser, etc. fabricated on such base structure.

2. Description of the Related Art

GaN and its related alloys comprising Al and In have many potential advantages, similar to the arsenide and phosphide alloys of these metals. These advantages stem from the ability to adjust the bandgap of the material by adjusting its composition, such that the bandgap of (Ga, Al, In) nitride can be adjusted from 1.9 to 6.2 eV. This characteristic of the (Ga, Al, In) nitride system lends itself to many applications, including UV-to-green LEDs, lasers and detectors, as well as high temperature, high power, and/or high frequency electronic devices. However, to date, there has been no effective lattice-matched substrate for the III-V nitrides, as exists for GaAs and InP based alloys. This circumstance has resulted in the use of "foreign" substrates for (Ga, Al, In)N device structures, using substrate materials such as sapphire, lithium gallate, lithium aluminate, zinc oxide, spinnel, magnesium oxide, silicon carbide, gallium arsenide, or silicon.

Of these foreign substrates, sapphire is the most commonly used for the growth of GaN-based materials and devices. However, sapphire, as well as many of the other foreign substrates, is electrically insulating with a low thermal conductivity and has a poor lattice-match to the (Ga, Al, In) nitride. As such, devices made from (Ga, Al, In) nitride grown on sapphire are limited by (1) high series resistance associated with inhibited lateral conduction of carriers through the bottom-most device layer to the active region of the device; (2) inability to dissipate heat away from the active region of the device; and (3) defects, dislocations and strain associated with the lattice-mismatch between the base layer and the substrate or between the conventional nucleation layer and the device structure.

The performance of GaN-based devices on insulating substrates is, in part, limited by the lateral conduction of carriers. An example of a basic GaN/InGaN light-emitting diode (LED) device 10 is shown in FIG. 1, which is a schematic drawing of a GaN/InGaN LED structure grown on an insulating substrate 12. In this device structure, an n-GaN layer 14 is formed on the substrate 12, with a (Ga, In)N active region 16 thereover. A p-GaN layer 18 is deposited on the (Ga, In)N layer, and overlaid by p contact layer 20. The n-GaN layer 14 has formed thereon an n contact layer 22, as shown. In this device, as a result of the insulating character of substrate 12, current must flow laterally through the thin n-type GaN layer. The lateral flow of current through the active region of the device is limited by the carrier transport in the thin n-type GaN layer, which in turn is limited by the thickness and conductivity of such n-GaN layer. This results in high series resistance which degrades device performance, lowers device efficiency and can result in shorter operation lifetimes due to excessive heat generation in this thin n-GaN layer.

The electrical conductance of this thin n-type conductive layer 14 is, in part, limited by the growth technique used to grow the device structure, in that the growth technique limits the attainable thickness which in turn limits the electrical conductance of the layer. For instance, the thickness of GaN and related alloys grown on sapphire by the most common techniques (molecular beam epitaxy (MBE) and metal-organic chemical vapor deposition (MOCVD)) is limited both by the slow growth rates inherent to these techniques and by the cracking of the epilayer, which develops for layers thicker than a few microns. Cracking becomes more severe for highly n-type Si-doped GaN grown by MBE and MOCVD, which causes unacceptable yield loss for a manufacturing process.

The operating characteristics and lifetime of many microelectronic devices are dependent on the operating temperature of the device. For example, the threshold current density (J) of a semiconductor laser is very sensitive to the temperature of the device, and is given by the equation:

$$J=J_0 \exp((T-T_0)/T_0),$$

where $J_0$ is the temperature independent threshold current density, $T_0$ is the characteristic temperature of the device and T is the operating temperature of the device. This equation indicates that the threshold current density increases exponentially with the operating temperature of the device. Low threshold current density is required for laser applications, thus, being able to remove heat from the active region of a diode laser is essential to its good performance. Similar benefits are obtained for transistors (in the achievement of enhanced stability and enhanced lifetime) and detectors (in the achievement of low noise characteristics).

For substrates that have low thermal conductivity, such as sapphire, heat must be removed laterally from the device by the thin semiconductor layer. The heat flow, H, is given by the equation:

$$H=-kA(dT/dx),$$

where k is the thermal conductivity of the material, A is the cross-sectional area through which the heat must flow, and dT/dx is the temperature gradient. This equation shows that the ability to dissipate heat is directly proportional to the cross-sectional area, and thus for a lateral device is directly proportional to the thickness of the material. As previously mentioned, the thickness of the material grown by MBE and MOCVD is limited by slow growth rates and cracking of the material. Thus, a thick base layer would be inherently superior in removing heat from the device. As described above, keeping the temperature low improves device performance, stability and lifetime.

The density of defects and dislocations in the active region of a device affects the performance of the device. In addition, degradation and eventual failure of devices is enhanced by defects. It is thus important to minimize the number of defects in the material that forms the devices. GaN grown on sapphire, silicon carbide or other similarly poorly lattice-matched substrate, typically contains 1E10 $cm^{-2}$ dislocations. The dislocations form to accommodate the difference in lattice constant between the substrate and GaN material grown on the substrate. Defects/dislocations generated in the initial layer propagate to the active region of the device. In addition, similar dislocations, although lower in density, occur because of lattice constant differences between the individual layers of the device. By growing thick base layers which are lattice-matched to the device structure, the total defect density could be significantly reduced. Control of the composition of the base layer could be employed to minimize the dislocations generated at the base layer-device material interface. By decreasing the defect density in the device material, longer-lived, higher performance devices could be realized.

The structural benefits are also applicable to GaN-based devices grown on conductive substrates, the most common conductive substrate for GaN based materials being silicon carbide. For these substrates, the art has proposed the formation of a multi-layer GaN/AlGaN epitaxial formation by MBE or MOCVD on the silicon carbide substrates, but such multi-layer formation of a GaN epitaxial layer is difficult to achieve, due to the close control of the deposition process required in each of the sublayer formation steps of the multi-layer formation technique.

Growth of GaN and related alloys on sapphire is complicated in that the growth conditions need to be very carefully controlled during the initial nucleation stages to achieve high quality material. Typically, thin nucleation layers (~200 Å) are grown at low temperature (~500° C.) prior to the growth of the GaN device structure. The thickness, growth rate and growth temperature must be controlled to extremely fine tolerances to achieve good product material.

Existing GaN LED devices fabricated with thin n-type GaN layers also exhibit high sensitivity to electrostatic discharge (ESD). It has been posited that the ESD sensitivity may result from reduced lateral carrier transport and a high density of vertical threading dislocations in the material (e.g., on the order of $10^9$-$10^{10}$ $cm^{-2}$).

The high density of defects, and threading dislocations in particular, in III-V nitride materials are responsible for a host of problems which degrade device performance and limit device lifetime. X. H. Wu, C. R. Elsass, A. C. Abare, M. P. Mack, S. Keller, P. M. Petroff, S. P. DenBaars, and J. Speck, Proceedings of the Second International Conference on Nitride Semiconductors, (1997) 34, showed that localized growth rate changes, alloy composition and 'V-defect' formation in InGaN-based multi-quantum wells originate at threading dislocations. H. M. Ng, D. Doppalapudi, D. Korakakis, R. Singh, and T. D. Moustakas, Proceedings of the Second International Conference on Nitride Semiconductors, (1997) 10, discloses that dislocations act as scattering centers.

S. J. Rosner, E. C. Carr, M. J. Ludowise, G. Girolami and H. I. Erikson, Appl. Phys. Lett, 70 (1997) 420, demonstrated a correlation between nonradiative recombination centers and threading dislocations. Magnesium was shown to migrate more readily away from desire regions of light-emitting diode device structures when a higher density of threading dislocations were present (N. Kuroda, C. Sasaoka, A. Kimura, A. Usui, and Y. Mochizuki, Proceedings of the Second International Conference on Nitride Semiconductors, (1997) 392).

U.S. Pat. No. 5,563,422 issued Oct. 8, 1996 to S. Nakamura et al. describes a gallium nitride-based III-V compound semiconductor device having a gallium nitride-based III-V compound semiconductor layer on a substrate, and an ohmic electrode provided in contact with the semiconductor layer. The substrate may be sapphire or other electrically insulating substrate.

In the Nakamura et al. patent, the GaN layer provided on the substrate is formed by MOCVD. In practice of the teachings of the Nakamura et al. patent, the GaN nucleation layer thickness achievable is only on the order of 100Å. The defect density in these nucleation layers is thought to be on the order of 1E11 $cm^{-2}$ or greater, and yields a defect density of 1E9 to 1E10 $cm^{-2}$ or greater in the subsequently grown GaN layer.

U.S. Pat. No. 5,393,993 issued Feb. 28, 1995 to J. A. Edmond, et al. describes a transition crystal structure between GaN and SiC. The transition structure consists of two or three individual layers of AlGaN. The Al mole percentage in these individual layers are substantially different from each other. However, in practice of the teachings of this Edmond et al. patent, the thickness of the individual layer thickness achievable is only on the order of 1000 Å, and the dislocation density is typically 1E8-1E9 $cm^{-2}$ in the subsequently grown GaN layer.

U.S. Pat. No. 5,523,589 issued Jun. 4, 1996 to J. A. Edmond et al. describes a vertical LED device on SiC substrates and includes a conductive AlGaInN buffer layer on SiC. The patent describes the formation of two graded composition layers. Such layers as mentioned hereinabove are extremely difficult to achieve.

U.S. Pat. No. 5,385,562 issued Jan. 31, 1995 to T. D. Moustakas describes a method of preparing highly insulating GaN single crystal films by MBE by a two step growth process which includes a low temperature nucleation step and a high temperature growth step. The low temperature nucleation process is carried out at 100–400° C., resulting in an amorphous GaN nucleation layer of thicknesses between 200 and 500 Å. The defect density in these nucleation layer is 1E11 $cm^{-2}$ or greater, and yields a defect density of 1E9 to 1E10 $cm^{-2}$ or greater in the subsequently grown GaN layer.

Japanese Patent 60-256806 to Akasaki et al. describes an AlN nucleation step, grown at 600° C. to thicknesses of approximately 50 nm by MOCVD. Similarly, the defect density in these nucleation layer is thought to be 1E11 $cm^{-2}$ or greater, and yields a defect density of 1E9 to 1E10 $cm^{-2}$ or greater in the subsequently grown GaN layer.

Accordingly, it would be a substantial advance in the art, and accordingly is an object of the present invention to provide a growth technique which can produce thick, crack-free, conductive base layers which can be employed in devices to permit enhanced lateral conduction, lower dislocation density, increased heat dissipation and reduced ESD sensitivity while at the same time simplifying the growth process, in relation to prior art services and techniques.

It is another object of the invention to provide a base material and method of forming same, which may be grown on poorly lattice-matched substrates which effectively reduce the defect density in (Ga, Al, In)N devices fabricated on the substrate.

It is yet another object of the invention to provide a base structure on which (Ga, Al, In)N devices may be grown without the excessively close tolerances in thickness, growth rate and growth temperature which are required by the thin nucleation layers of the prior art.

It is a further object of the invention to provide a (Ga, Al, In)N device article including a device such as a light emitting diode, laser, detector, transistor (e.g., field effect transistor), rectifier device, filter, etc. which is fabricated on a base structure including a base layer on a substrate.

Other objects and advantages of the present invention will be more fully apparent from the ensuing disclosure.

SUMMARY OF THE INVENTION

In one aspect, the present invention relates to a method of forming a gallium nitride base layer on a substrate for subsequent fabrication of a microelectronic device structure on the substrate, and to a base structure for such fabrication, including a single-crystal, crack-free base layer of (Ga, Al, In) nitride thereon, in which the thickness of the base layer may, for example, be on the order of 2 microns and greater and the defect density of the base layer may, for example, be on the order of 1E8 $cm^{-2}$ ($1\times10^8$ $cm^{-2}$) or lower, e.g., 1E7 $cm^{-2}$ and below.

It will be understood that while the present invention is described hereinafter with specific reference to GaN base layers, such base layers alternatively could be formed of other (Ga, Al, In)N species.

In another aspect, the present invention relates to a device article comprising a device, e.g., a (Ga, Al, In)N device, on a base structure including a substrate having a base layer of (Ga, Al, In)N thereon.

As used herein, the term (Ga, Al, In) is intended to be broadly construed to include the single species, Ga, Al, and In, and well as binary and ternary compositions of such Group III metal species. Accordingly, the term (Ga, Al, In)N comprehends the compounds GaN, AlN, and InN, as well as the ternary compounds GaAlN, GaInN, and AlInN, and the quaternary compound GaAlInN, as species included in such nomenclature. Accordingly, it will be appreciated that the ensuing discussion of GaN base layers for formation of GaN-based device structures or precursors thereof, is applicable to the formation of other (Ga, Al, In)N base layers and devices.

As used herein, the term crack-free refers to a material layer in which no cracks intersect the growth surface (typically the top or uppermost surface) of the layer.

As used herein, the term base structure refers to a structure including a substrate and a base layer on the substrate, optionally with one or more intermediate layer(s) between the substrate and base layer.

As used herein, the term device precursor refers to a structure formed by carrying out at least one but less than all device fabrication steps. The precursor structure typically includes at least one epitaxial layer of the device to be formed on the base layer of the base structure. The fabrication steps may include, for example, ion implantation, etching, deposition of an epitaxial layer, patterning, masking, etc.

In one aspect, the invention relates to a method of forming a (Ga, Al, In) nitride base layer on a substrate, comprising reacting a vapor-phase (Ga, Al, In) composition, such as a (Ga, Al, In) compound or complex, e.g., (Ga, Al, In)chloride, (Ga, Al, In)bromide, etc., with a vapor-phase nitrogenous compound in the presence of the substrate, to grow a (Ga, Al, In) nitride base layer on the substrate, thereby yielding a microelectronic device foundation comprising the substrate with the (Ga, Al, In) nitride base layer thereon.

Accordingly, in reference hereafter to GaN as the base layer species, such process aspect of the invention comprises reacting a vapor-phase gallium compound such as gallium chloride with a vapor-phase nitrogenous compound in the presence of the substrate, to grow a gallium nitride base layer on the substrate, thereby yielding a microelectronic device foundation comprising the substrate with the gallium nitride base layer thereon.

The nitrogenous compound may be any suitable nitrogen-containing compound, such as ammonia, hydrazine, amines, polyamines, etc.

In a preferred aspect of such method, vapor-phase gallium chloride is formed by contacting vapor-phase hydrogen chloride with molten gallium. The molten gallium desirably is of very high purity, preferably having a purity of "5-9s" (i.e., 99.99999$^+$%), and more preferably having a purity of "7-9s" (i.e., 99.9999999$^+$%).

The substrate in the above method may be of any suitable material, such as sapphire, silicon, silicon carbide, diamond, lithium gallate, lithium aluminate, zinc oxide, spinel, magnesium oxide, $ScAlMgO_4$, gallium arsenide, silicon-on-insulator, carbonized silicon-on-insulator, carbonized silicon-on-silicon, gallium nitride, etc., including conductive as well as insulating and semi-insulating substrates, twist-bonded substrates (i.e., where the substrate of crystalline material is bonded to another single crystal substrate material with a finite angular crystallographic misaligment), compliant substrates of the type disclosed in U.S. Pat. No. 5,563,428 to B. A. Ek et al., etc.

The layer of single crystal (Ga, Al, In)N may be deposited directly on the surface of the crystalline substrate, or alternatively it may be deposited on an uppermost surface of one or more intermediate layers which in turn are deposited on the crystalline substrate. The one or more intermediate layers may serve as a nucleation layer to enhance the crystallinity or other characteristics of the (Ga, Al, In)N layer, as a template for the subsequent (Ga, Al, In)N growth thereon, or as protective layer(s) from the HVPE environment.

Intermediate layer(s) may be deposited within the same reactor used for the base layer growth or pre-deposited in a separate reactor prior to base layer growth. Alternatively, the intermediate layer(s) may be formed in any other suitable manner for provision of same on the substrate, and may for example be formed separately as a discrete layer which then is bonded or placed on the substrate. Such intermediate layers may be comprised of, e.g., ZnO, SiC, carbonized silicon, (Ga, Al, In)N, and alloys of SiC and (Ga, Al, In)N.

The growth of the (Ga, Al, In)N material may be carried out in a hydride vapor phase epitaxy (HVPE) reactor. As mentioned, a protective layer may be employed to prevent decomposition of the single crystal substrate while (Ga, Al, In)N growth is proceeding. Such protective layer should be of a material favorable for (Ga, Al, In)N deposition. Examples include materials such as (Ga, Al, In)N or SiC and alloys thereof, wherein the protective layer is of a different material than the main body of the substrate, or is otherwise differently formed on the main body of the substrate, e.g., under different process conditions. The protective layer may be formed by any suitable technique such as for example sputtering, chemical vapor deposition (CVD), metalorganic chemical vapor deposition (MOCVD), ion plating, molecular beam epitaxy (MBE), vapor phase epitaxy (VPE), metalorganic vapor phase epitaxy (MOVPE), etc.

The intermediate layer(s) serve as a suitable template for the growth of single crystal (Ga, Al, In)N. As such, it is not required that the main body of the substrate be single crystal. For example, a thin single crystal intermediate layer may be bonded to or otherwise consolidated with or formed on a polycrystalline main substrate body. The properties of the material used as the main body of the substrate can be selected to reduce stress during or after the growth and cool down process. Correspondingly, the main body of the substrate can be chosen such that the (Ga, Al, In)N material and substrate are under stress during growth, but this stress is relieved at room temperature after cool down. For example, the thermal coefficient of expansion of the material used as the main body is one property which can be chosen for this purpose.

Concerning the intermediate layer(s) usefully employed in some applications of the present invention, the initial stages of HVPE growth can largely determine the net electrical properties of the entire base structure including the intermediate layer, base layer and substrate. For instance, for GaN grown directly on sapphire by HVPE, it is common that a high density of electronic charge is present within 500 nm of the sapphire. However, if an intermediate layer is used, such as GaN grown by MOCVD, between the HVPE GaN and sapphire, this interface charge density can be reduced and the net donor concentration for the overall base structure is reduced. The interface electrical properties affect the gross electrical properties of the entire base structure. This fact can be taken advantage of in selecting the substrate and/or intermediate layer to determine the bulk electrical properties of the overall base structure.

The substrate may be patterned, e.g., with a dielectric such as $SiO_2$ or $Si_3N_4$, or other material that nucleates substantially less well than the substrate, to permit nucleation and direct growth on specific regions of the substrate, and little to no nucleation on other regions of the substrate. Patterning could also be carried out on an intermediate layer between the substrate and the (Ga, Al, In)N material to be grown. In either case, the HVPE process may also be carried out to grow the (Ga, Al, In)N material laterally over the dielectric from the regions between the dielectric.

The base layer grown by the aforementioned method may be grown at relatively high rate, e.g., at a growth rate of at least 10 µm/hour, and more preferably of at least 50 µm/hour, to produce a single-crystal, substantially crack-free base layer characterized by an upper surface region with a low defect density, e.g., less than 1E8 defects/cm$^3$, and preferably less than 1E7 defects/cm$^3$.

The aforementioned base structure formed by the method of the invention may then be used to form a microelectronic device on the base layer, by a suitable process such as ion implantation and/or etching, or by a process including deposition of device layers by a suitable deposition technique, e.g., metalorganic chemical vapor deposition (MOCVD), molecular-beam epitaxy (MBE), etc.

In another aspect, the invention relates to a base structure for fabrication of a microelectronic (Ga, Al, In)N device structure thereon, comprising a substrate and a single-crystal, crack-free base layer of (Ga, Al, In)N thereon. In some applications, the thickness of the base layer is at least about 2 microns, e.g., with a thickness in the range of from about 0.5 microns to about 1000 microns, preferably from about 2 microns to about 50 microns, more preferably from about 2 microns to about 25 microns, and most preferably from about 5 microns to about 20 microns. In other applications, the base layer desirably has a thickness of at least 10 microns, and more preferably at least 100 microns.

It will be recognized that the preferred thickness of the base layer in a given application will be substrate-dependent and will also depend on the ultimate use. For sapphire, 2 to 25 microns thick layers minimize bow and cracking while yielding low dislocation density (1E9 to 1E8 cm$^{-2}$) and smooth surfaces. Much thicker films enable much lower dislocation densities. For instance, 300 microns thick GaN grown on sapphire by HVPE yield dislocation densities of less than 1E7 cm$^{-2}$, respectively. Lower dislocation densities can be achieved for significantly thinner GaN base layers on SiC due to the closer lattice match between GaN and SiC.

In a still further aspect, the present invention relates to a GaN device structure, comprising a substrate, a single-crystal, crack-free (Ga, Al, In)N base layer on the substrate, and a GaN microelectronic device or a precursor thereof on the (Ga, Al, In)N base layer.

The low defect density material of the invention may be of significant thickness, e.g., greater than 100 microns in thickness (in the growth direction). The low defect density material has a defect density, measured on sapphire as a reference material, that is less than about 1E7 defects/cm$^2$ at the upper surface of the material.

In another aspect, the invention relates to an unsupported base layer derived from a base structure which has been processed by suitable means and/or methods, e.g, chemical and/or mechanical in character, to remove the substrate from the base structure and leave only a free-standing (Ga, Al, In)N article, as a foundation element for subsequent device fabrication. Such substrate removal may be carried out either in situ or ex situ with respect to the growth of the base layer on the substrate in the first instance. The removal may for example by carried out ex situ by methods such as wet etching of the substrate, or laser ablation of the substrate. Such substrate removal may be carried out by separating the base layer from the substrate, for example by thermally decomposing a portion of the base layer or substrate near the base layer-substrate interface or by inducing an internal pressure at the base layer-substrate interface by a technique such as implantation of ions or other chemical species in the substrate following which the substrate is coated with the base layer and the resulting base structure is subjected to elevated temperature conditions to induce fractural separation of the substrate from the base layer, etc. Alternatively, the substrate may be removed in situ from a (Ga, Al, In)N base layer after the (Ga, Al, In)N base layer has been formed on the substrate, as for example in the manner disclosed in U.S. Pat. No. 5,679,152 issued on Oct. 21, 1997 for "A METHOD OF MAKING A SINGLE CRYSTAL GaN ARTICLE."

The foregoing approaches for removing the base layer from the substrate may be usefully employed if the base layers are thick enough to be free-standing, as for example with thicknesses in excess of 100 microns, for subsequent use of the base layer as a residual support or substrate element, or with lower thicknesses, for subsequent use of the base layer as a discrete device layer.

The substrate upon which the HVPE base layer(s) are provided can be tailored to enhance the bulk properties of the overall base structure. For instance, differences in the thermal coefficient of expansion for a base layer and a substrate can cause cracking and bowing upon cool-down after growth. Thus, by using substrates with the same thermal coefficient of expansion as the base layer, cracking and bowing are minimized. Since intermediate layers can be placed upon the substrate, the substrate is not required to be single crystal. Similarly, the substrate material can be chosen so that it can be easily removed in situ or ex situ.

Other aspects and features of the invention will be more fully apparent from the ensuing disclosure.

DETAILED DESCRIPTION OF THE INVENTION, AND PREFERRED EMBODIMENTS THEREOF

The present invention is based on the discovery that hydride vapor phase epitaxy (HVPE) may be usefully employed for the growth of thick microelectronic device quality (Ga, Al, In)N, e.g., GaN, base layers on insulating substrates, such as sapphire, as well as conductive substrates, such as silicon carbide. The HVPE technique provides a high growth rate and uses low-cost precursors.

The low defect density HVPE base layers of the present invention resolve problems in the microelectronic devices formed on the base layers. Defects, and in particular threading dislocations, cause a number of problems in the device layers, including alloy thickness and composition non-uniformities, 'V-defect' formation, and dopant migration. In addition, the dreading dislocations in GaN-based material have been shown to act as scattering and non-radiative recombination centers.

The aforementioned problems lead to degradation and accelerate the eventual failure of devices and/or decreased device performance. It is therefore important to minimize the number of defects in the material that forms the devices. GaN grown on sapphire, silicon carbide or other similarly poorly lattice-matched substrate, typically contains 1E10 $cm^{-2}$ dislocations which form to accommodate the difference in lattice constant between the substrate and GaN material grown on the substrate. Defects/dislocations generated in the initial layer propagate into the active region of the device. Thick HVPE base layers have reduced defect density as compared to MOVPE or MBE-grown device layers. For instance, a 25 microns thick GaN base layers grown on sapphire by HVPE contained approximately 1E8 $cm^{-2}$ dislocations. For a second instance, a 300 microns thick GaN base layer grown on sapphire by HVPE contained less than 1E7 $cm^{-2}$ dislocations.

In addition, similar defects, although fewer, occur due to lattice constant differences between the base layer and the device. Control of the composition of the (Ga, Al, In) nitride base layer, and therefore the lattice constant of the base layer, minimizes the defects generated at the base layer-device material interface. Compositions from InN to AlN are achievable by this technique. By growing thick HVPE base layers which are lattice-matched to the device structure, the total defect density may be substantially reduced. By decreasing the defect density in the device material, longer-lived, higher performance devices are realized.

In a specific aspect of the HVPE process of the present invention, HCl may be passed over a source of high purity gallium (Ga), to form volatile GaCl which is transported to a deposition zone where it reacts with ammonia ($NH_3$) to form GaN.

An analogous sequence may be employed to transport In or Al which will allow the growth of (Ga, Al, In)N alloys.

Figure 2:
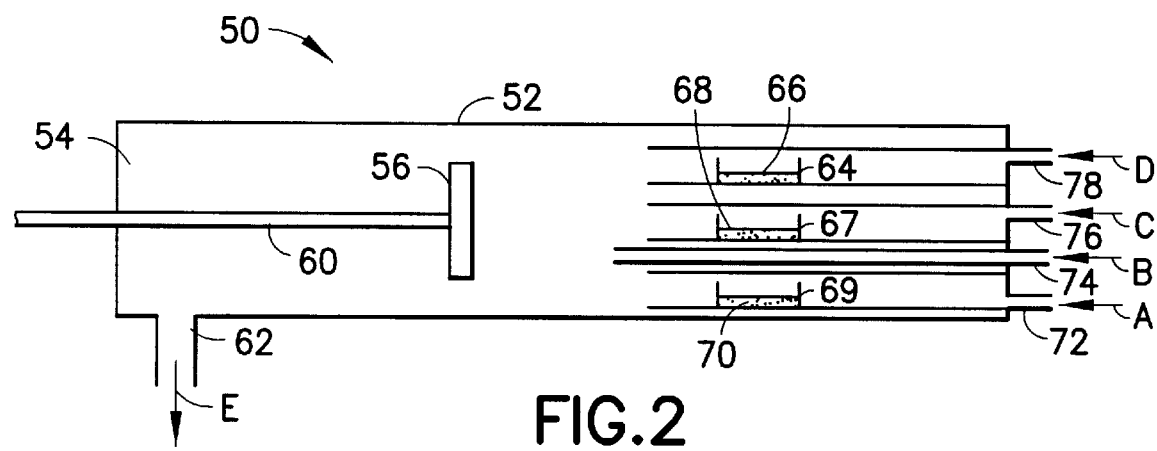
FIG. 2 is a schematic representation of a hydride vapor phase epitaxy (HVPE) reactor used to grow thick (Ga, Al, In)N base layers.

A schematic representation of a suitable system for (Ga, Al, In)N alloy growth is shown in FIG. 2. The process system 50 includes an HVPE reactor 52, which may, for example, comprise a reactor housing defining an interior reactor volume 54 therewithin. The reactor is provided with feed ports 72, 74, 76, and 78. HCl is introduced to the reactor in feed ports 72, 76'and 78, being introduced in the direction indicated by arrows A, C, and D, respectively. Feed port 74 accommodates the introduction of ammonia or other nitrogenous species into the reactor in the direction indicated by arrow B. The reactor is provided with an exhaust port 62, for discharge of exhaust gases from the reactor in the direction indicated by the arrow E.

A substrate 56 for the growth of the (Ga, Al, In)N base layer (or alternatively, a GaN base layer per se) is mounted on support 60, to present a face of the substrate to the gases for deposition thereon.

A vessel 64 of molten indium 66 is provided in the interior volume of the reactor 52, in gas flow communication with port 78 through which HCl is introduced in the direction indicated by arrow D. Correspondingly, a vessel 69 of molten gallium is provided in gas flow communication with feed port 72, through which HCl is introduced in the direction indicated by arrow A and a vessel 67 of molten aluminum is provided in gas flow communication with feed port 76, through which HCl is introduced in the direction indicated by arrow C.

By the process system shown in FIG. 2, HCl from port 78 is flowed in contact with indium 66 to form indium chloride which then is transported to the deposition zone where it reacts with ammonia introduced in feed port 74, to form InN on the substrate. In like manner, HCl from feed port 76 and 78 is flowed into contact with high purity gallium 70 and high purity aluminum 68 and the resultingly formed volatile gallium chloride and aluminum chloride, respectively, are transported to the deposition zone where it reacts with ammonia to form GaN and AlN, for deposition on the substrate 56.

By this arrangement, (Ga, Al, In)N base layers may be formed on the substrate. A similar reactor configuration may be employed to deposit a GaN base layer per se, without the provision of indium or aluminum source vessels containing indium or aluminum in the interior volume of the reactor. With the indium, gallium and aluminum installed, composition of the (Ga, Al, In)N is controlled by the flow of HCl over each metal as well as by the substrate temperature and by the temperature of each metal. Because variation of the individual flows is relatively easy in the HVPE reactor, the composition of the (Ga, Al, In)N base layers can be graded with thickness. Alternately, one or more layers of different (Ga, Al, In)N composition can be grown in the same growth run and same base layer.

Concerning Al and AlGa nitride base layers more specifically, the growth of Al-containing nitride compounds such as AlN and AlGaN is complicated by several factors. The first complication is that of the choice of Al source. The conventional HVPE method utilizes HCl to transport the metallic Group III elements to the growing surface. In the case of Al, $AlCl_x$ is formed which reacts rapidly with fused quartz which is the most common material used to construct the growth reactor. In addition, liquid Al expands upon solidification when cooled to below its freezing point (660° C.) and thus destroys the vessel which holds the Al. The metallic Al also readily oxidizes.

To circumvent these problems, one potential Al source is metallic Al which is contained in a vessel of alternate construction (such as sapphire or graphite), continuously maintained at temperatures above 660° C. until the Al is completely consumed, continuously purged with high purity $H_2$ or inert gas, and continuously maintained at subatmospheric pressures to minimize oxidation.

Since for Al-containing HVPE compounds, the Al is transported to the substrate in the form of $AlCl_x$, whose high reactivity with quartz reactor parts would destroy a quartz reactor and incorporate significant impurities into the growing films, the entire growth reactor and/or reactor liner which are employed should be constructed of alternative high temperature compatible materials, such as sapphire or graphite.

The system is usually a multi-zoned hot-wall reactor, where the temperature of the molten metals (Ga, Al, In) and the deposition zone are independently controlled. The deposition temperature needed to produce single crystal GaN was between 900 and 1100° C., with the best quality GaN grown between 1000 and 1100° C. In order to get significant incorporation of In into In-containing alloys, it may be desirable to reduce the deposition temperature to suitably low temperatures, e.g., between 650 and 1100° C. To get sufficiently smooth surface morphology and good crystal quality AlN, it may be desirable to employ higher growth temperatures of 1000 to 1400° C.

Subatmospheric pressure conditions employed during growth are particularly beneficial in preventing the occurrence of gas phase reactions before the gases arrive at the substrate and to improve on film uniformity. HVPE growth of (Ga, Al, In)N is also able to be accomplished at low pressure. Very rapid growth rates (>130 µm/hr) and good uniformity (±10%) were achieved for growth of GaN at 50 Torr. Based on results from GaAs and GaAsP HVPE growth, further reductions in growth pressure are expected to improve uniformity across the wafer and across multiple wafers within one growth run.

The initial stages of HVPE growth can largely determine the electrical properties of the entire base structure. For instance, for GaN grown directly on sapphire by HVPE, it is common that a high density ($N_D$>1E20 $cm^{-3}$) of electronic charge is present within 500 nm of the sapphire. However, if an intermediate layer is used, such as GaN grown by MOCVD between the HVPE GaN and sapphire, this interface charge density can be significantly reduced. In this way the averaged donor concentration for the entire HVPE base structure is reduced, as we have empirically demonstrated as low as 1E16 $cm^{-3}$. In this way, the substrate or intermediate layer can be chosen to influence the electrical properties of the bulk of the HVPE base structure.

With respect to doping, the HVPE process permits gases to be introduced as constituents of the gas stream (either as a dopant gas or as HCl passed over a molten form of a pure metal dopant). The background electron concentration in HVPE-grown GaN is suitably low for doping. In addition, the concentration of dopants are readily held constant or graded throughout the thickness of the (Ga, Al, In)N base layers by varying the flow of the dopant gas.

N-type conduction may be enhanced by incorporating Si, Ge, S, O, or Se into the HVPE (Ga, Al, In)N. For example, Si introduced into the gas phase as silane is a convenient and effective n-type dopant. We have controllably doped HVPE GaN with silane to yield donor concentrations ranging from 3E16 to 8E18 $cm^{-3}$.

P-type conduction may be enhanced by incorporating Mg, Be, Zn, C or Cd into the HVPE (Ga, Al, In)N. For example, Mg or Be are convenient and effective p-type dopants.

Semi-insulating (Ga, Al, In)N may be effected by reducing the background carrier concentration and then introducing the proper amount of deep level defects to compensate for the remaining n-type background. The deep levels compensate for residual shallow impurities in the material, causing the Fermi level to reside near the center of the band gap, resulting in high resistivity material. Useful elements which may be employed to introduce deep electronic states in (Ga, Al, In)N include Fe, Cr, V, Zn and Mg. For example, Fe in the form of ferrocine or HCl reacted with molten Fe is a convenient and effective deep level dopant for making semi-insulating (Ga, Al, In)N. Semi-insulating doping preferably is carried out with dopant species having a suitably large activation energy, e.g., an activation energy greater than about 25% of the bandgap energy of the material being doped.

Thus, the conductivity and conductivity type of the (Ga, Al, In)N base layers can be varied according to the application. For enhanced lateral transport, the conductivity can be increased by incorporating an n-type or p-type dopant. For device isolation, semi-insulating base layers are effective. Use of semi-insulating base layers is particularly important for electronic devices with lateral current flow.

By the method of the invention, thick, crack-free, conductive GaN, ternary alloy (GaInN, GaAlN, AlInN), or quaternary alloy (GaAlInN) base layers are grown by HVPE to (i) enhance lateral electrical and thermal conduction, reduce dislocation density and ESD sensitivity, and thus ultimately improve device performance, as well as (ii) simplify the growth of device structures by conventional growth techniques.

Figure 1:
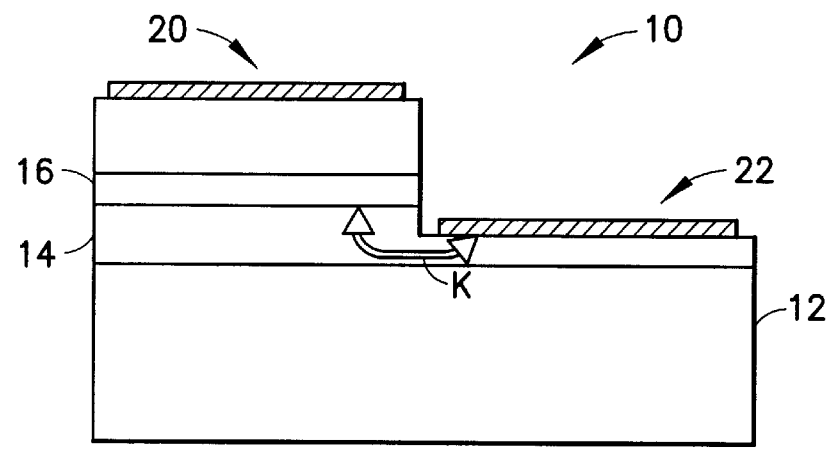
FIG. 1 is a schematic representation of a GaN/InGaN light emitting diode structure grown on an insulating substrate.

An HVPE base layer in accordance with the invention thus can be employed to enhance the lateral conduction (indicated by the conduction path K) of the simple device shown in FIG. 1.

Figure 3:
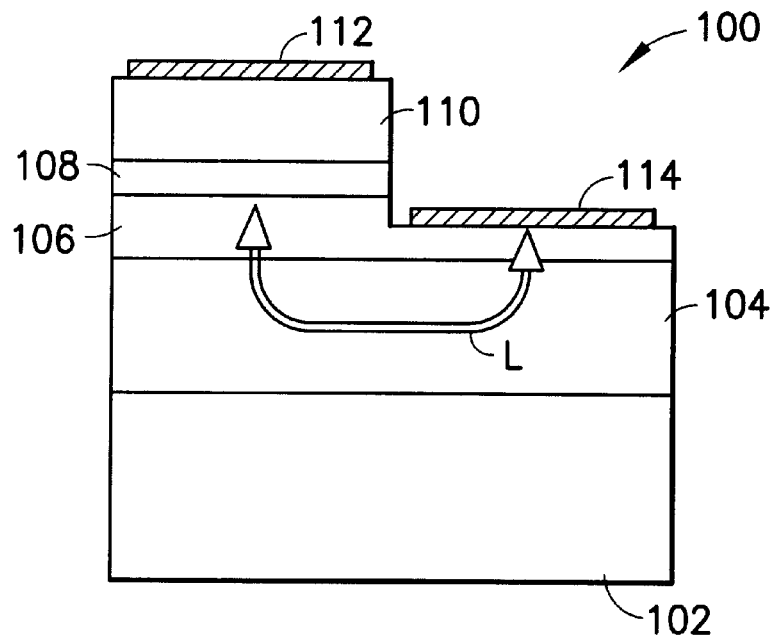
FIG. 3 is a schematic representation of a GaN/InGaN light emitting diode structure grown on an insulating substrate and employing a thick GaN HVPE base layer to enhance lateral carrier support in the structure.

A GaN/InGaN LED structure 100 which utilizes a thick n-type GaN HVPE-grown base layer 104 for this purpose is shown in FIG. 3. The LED structure 100 comprises an insulating substrate 102 on which the n-type GaN HVPE base layer 104 is formed. The base layer is overlaid by the n-type GaN layer 106, an intermediate (InGa)N active layer 108 and an upper p-type GaN layer 110. The p-type GaN layer 110 has a p contact layer 112 formed thereon, and the lower n-type GaN layer 106 has an n contact layer 114 formed on the right-hand portion thereof, in the view shown. Such arrangement provides a lateral conduction path L. The conductance in the n-type layer is directly proportional to the thickness of that layer. Thus, the lateral conduction in a device of the type shown may be easily increased by 3–4 times (relative to the structure shown in FIG. 1) by adding a 10–15 microns thick n-type GaN HVPE base layer to the original structure.

In addition, subsequent growth of device structures on the HVPE base layers is simplified, as compared with prior art GaN device fabrication on foreign (poor lattice-matched) substrates. Instead of complicated nucleation layers requiring very tight control of many growth-related parameters, growth is initiated by heating to the growth temperature in an over pressure of ammonia or other nitrogen source gas, at which point growth of the device structure is started. This growth process is similar to that used for the growth of devices on GaAs and InP substrates.

The growth of thick, crack-free and conductive GaN by HVPE in accordance with the invention may be carried out at high growth rates, e.g., rates in excess of 100 $\mu$m/hr.

Figure 4:
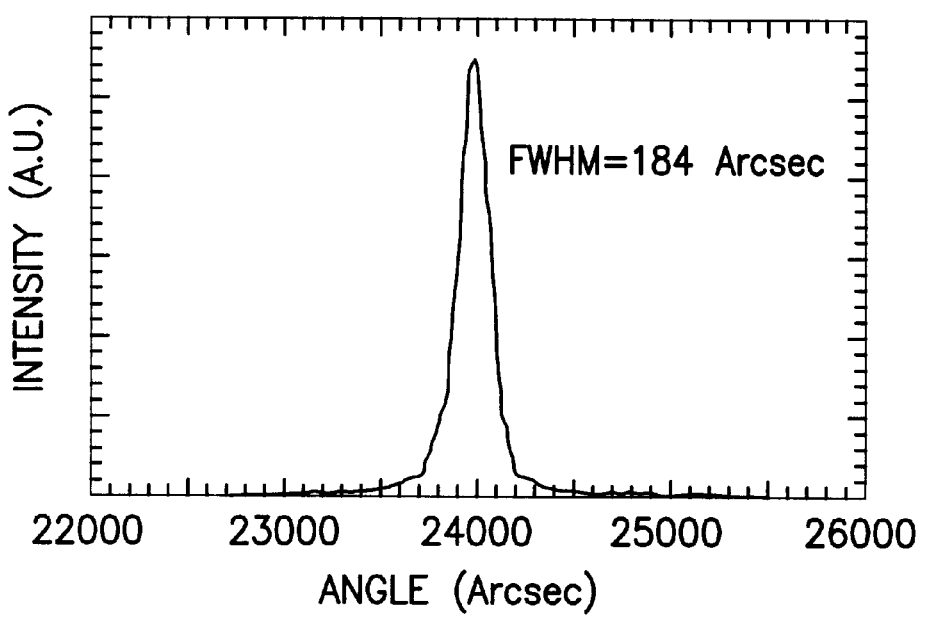
FIG. 4 is a double-crystal x-ray rocking curve for a GaN layer grown on (0001) sapphire by HVPE.
Figure 5:
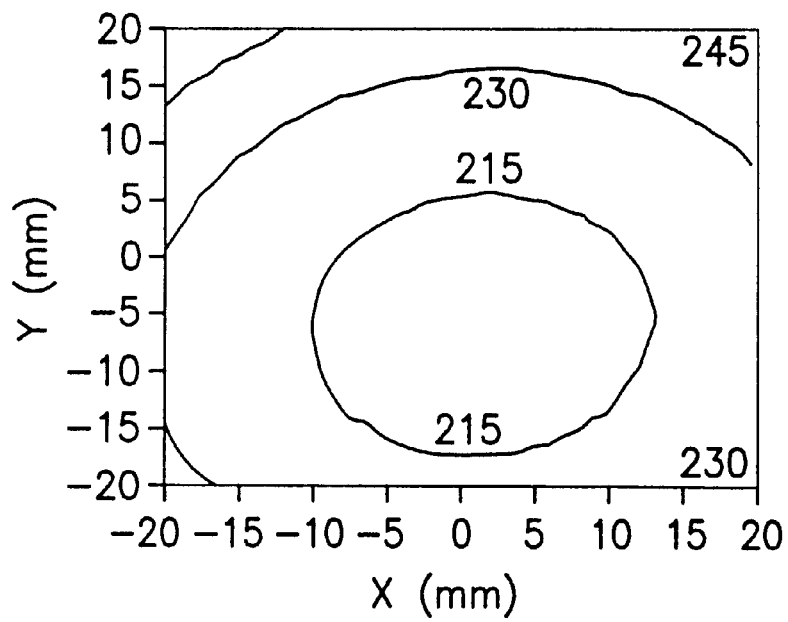
FIG. 5 is a contour map of the FWHM of a double-crystal x-ray rocking curve across a two-inch wafer of GaN grown on (0001) sapphire by HVPE.
Figure 7:
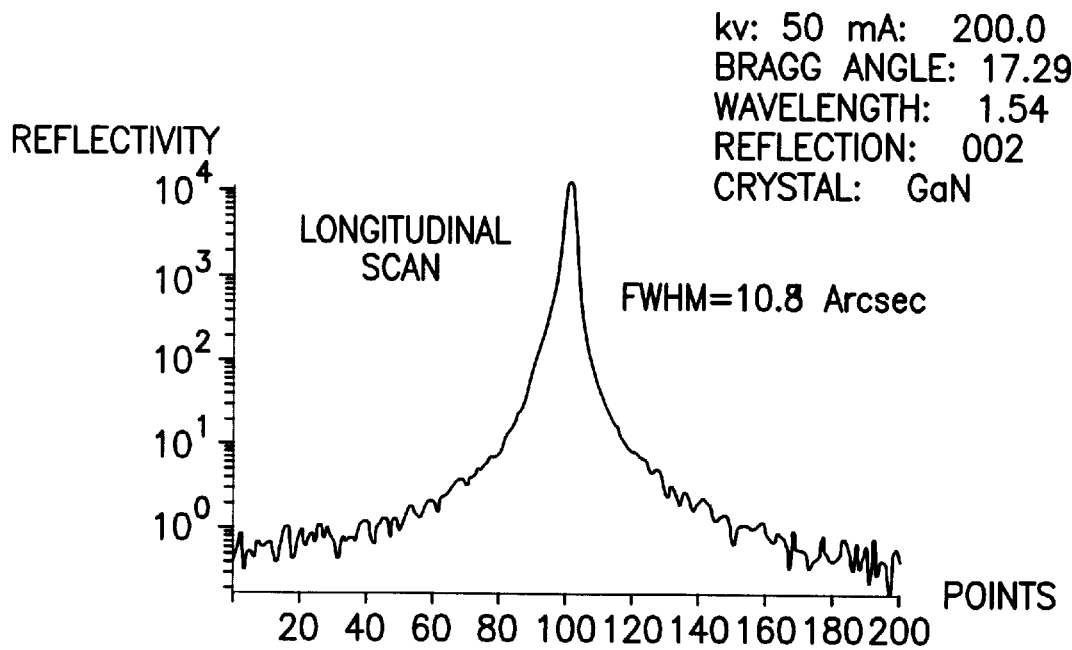
FIG. 7 is a longitudinal scan of the HVPE GaN grown on sapphire whose diffraction spectrum reciprocal space map is shown in FIG. 6.
Figure 8:
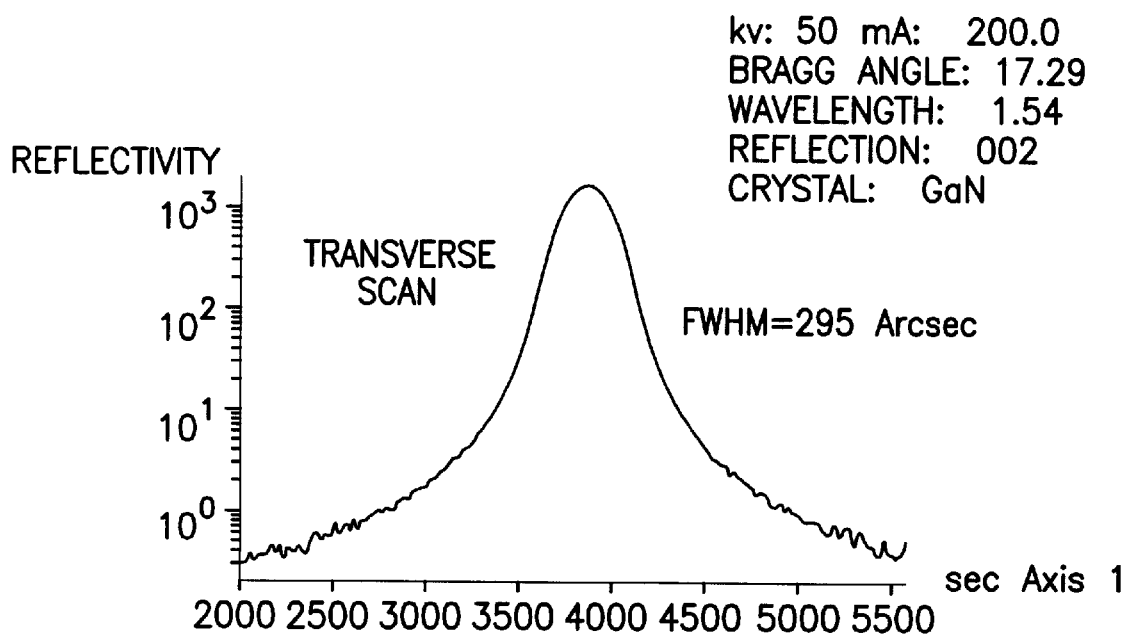
FIG. 8 is a transverse scan of the HVPE GaN grown on sapphire, the diffraction spectrum reciprocal space map of which is shown in FIG. 6 and the longitudinal scan of which is shown in FIG. 7.

As a specific example of the characteristics of structures formed by the method of the present invention, GaN grown on sapphire in accordance with the invention has excellent structural, electrical and optical characteristics. Very high crystal quality for such GaN is demonstrated by the narrow double crystal x-ray rocking curve (best FWHM=184 arcsec) shown in FIG. 4, as representative of the present invention. The FIG. 4 rocking curve was obtained for a GaN layer grown by HVPE on (0001) sapphire. The crystal quality of such representative sample is uniform, as can be seen by looking at the contour map of the full width half mean (FWHM) across a 2-inch wafer of GaN grown on (0001) sapphire by HVPE, as shown in FIG. 5. In addition, reciprocal lattice x-ray diffraction (shown in the reciprocal space map of FIG. 6, with the corresponding longitudinal scan and transverse scan plots being shown in FIG. 7 and 8, respectively) reveals that the GaN layers grown by HVPE on sapphire exhibit very little strain, as compared with GaN grown by MOCVD or MBE. This small amount of strain is evidenced by the very narrow FWHM (10.8 arcsec) of the longitudinal x-ray scan of FIG. 7.

Figure 9:
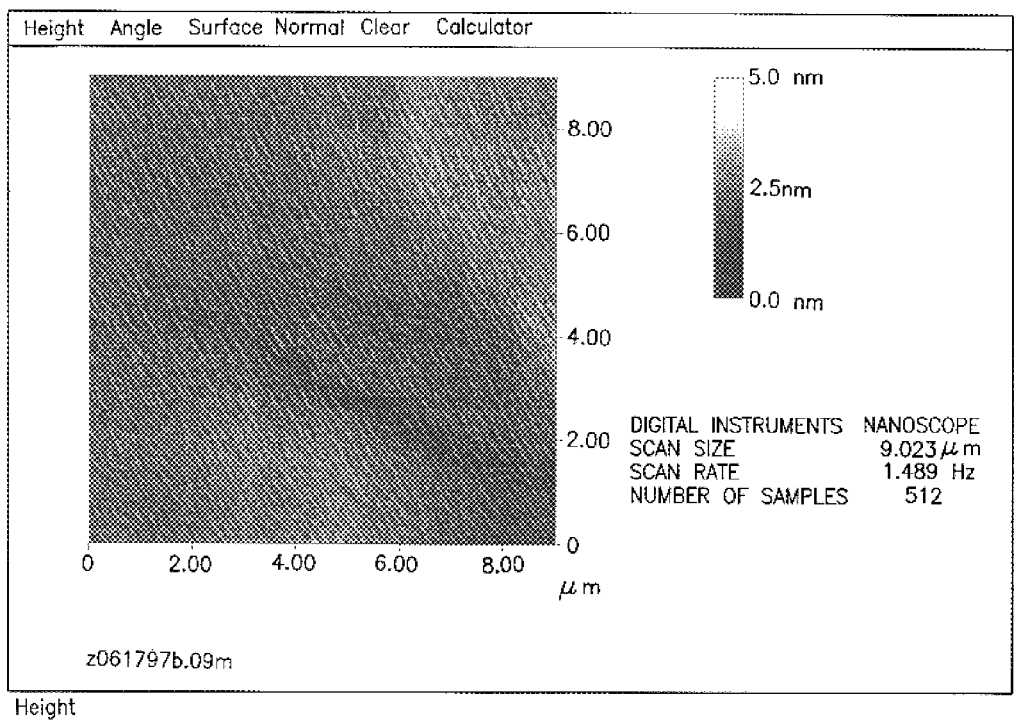
FIG. 9 is an atomic force microscope image of a 9 micron by 9 micron area of the surface of a HVPE GaN sample grown on (0001) sapphire.
Figure 10:
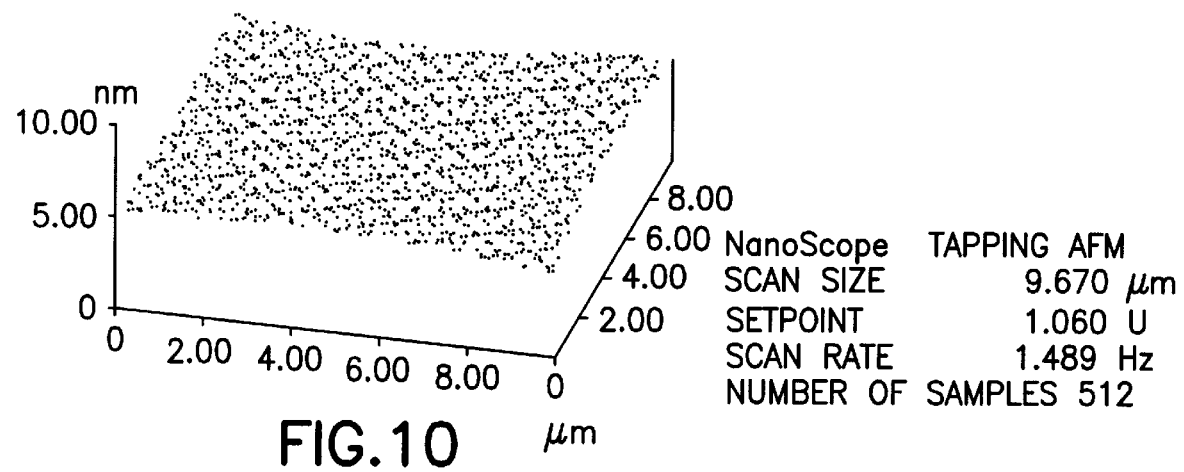
FIG. 10 is a graphical depiction of the atomic force microscope image of FIG. 9.

The surface morphology of the HVPE GaN layer is relatively smooth and is specular to the eye. An atomic force microscope image of the surface of a GaN HVPE layer grown on (0001) sapphire is shown in FIG. 9. FIG. 10 is a graphical depiction of the atomic force microscope image of FIG. 9. The RMS roughness of smooth HVPE GaN base layers on sapphire were measured to be as low as 2 Å.

Figure 22:
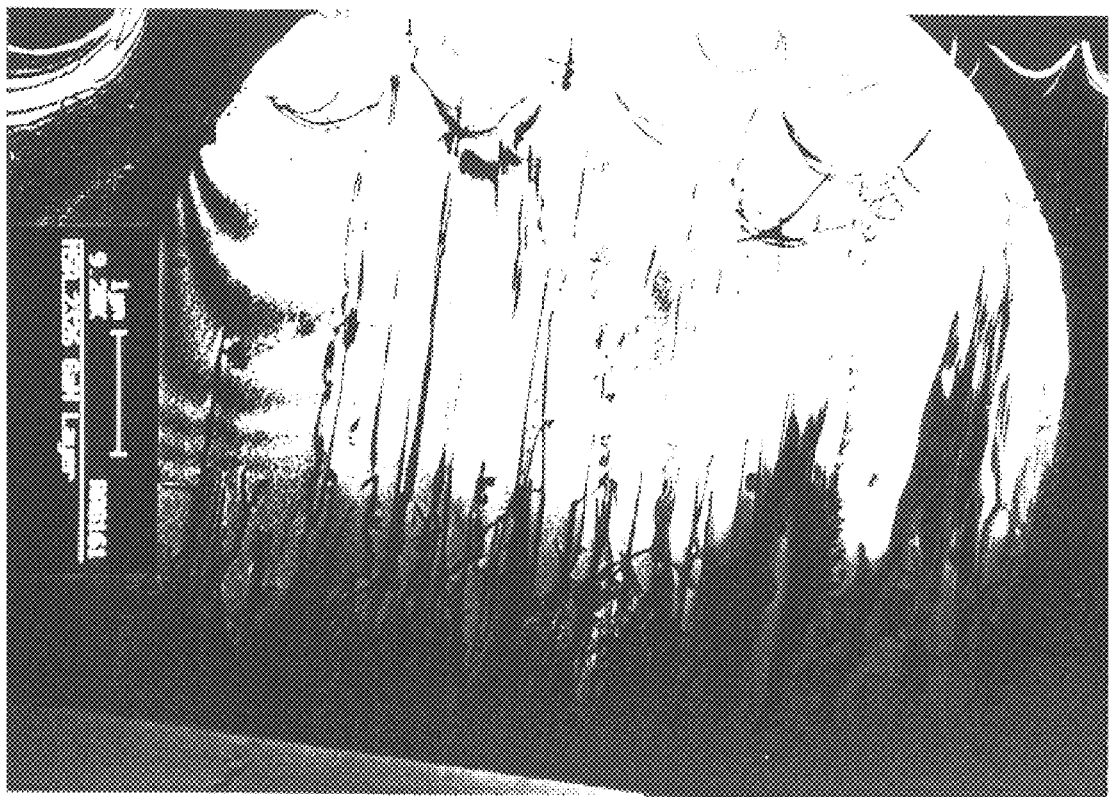
FIG. 22 is a cross-sectional transmission electron microscope image of a 10 $\mu$m thick GaN base layer grown on sapphire by HVPE.

A TEM image for a 10 $\mu$m thick GaN film grown by HVPE on sapphire is shown in cross-section in FIG. 22. The 1 to 2 $\mu$m of GaN closest to the GaN-sapphire interface is highly defective, however the vast majority of defects in this region do not propagate beyond 2 $\mu$m. This can be contrasted with nucleation layers and subsequent GaN layers realized by MOCVD or MBE, while the highly defective region is confined to much less than 0.5 $\mu$m, the defect density beyond the conventional nucleation layer generally has a greater density of defects (greater than 1E10 cm$^{-2}$). For the HVPE layer shown in FIG. 22, the dislocation density at the top surface (at 10 $\mu$m) can best be counted by plan view TEM, which revealed that the average dislocation density for this sample was approximately 1E9 cm$^{-2}$. This dislocation density was reduced by increasing the thickness of the HVPE GaN buffer layer. For a 23 $\mu$m GaN sample grown on sapphire, the density of defects at the surface was reduced to approximately 1E8 cm$^{-2}$. The dislocation density reduction continues, such that 300 –m thick GaN layers grown by HVPE on sapphire had dislocation densities less than 1E7 cm$^{-2}$. The dislocation density decreased with base layer thickness—this characteristic relates directly to improved device performance and lifetime.

The electrical characteristics of the GaN HVPE layers of the invention have also been measured. Room temperature Hall effect measurements have determined such GaN layers to be n-type, as illustratively grown with a background carrier concentration of 1E8 cm$^{-3}$ and mobility of 90 cm$^2$/V-s. In addition, room temperature mobilities in excess of 800 cm$^2$/V-s at lower doping levels (e.g., 1.2E17 cm$^{-3}$) are readily achievable in the practice of the present invention.

The optical properties of the GaN HVPE material of the invention are also comparable to material grown by MOCVD and MBE. A room temperature photoluminescence (PL) spectrum is shown in FIG. 10 for an illustrative HVPE GaN material grown on (0001) sapphire. The spectrum is dominated by near band edge emission at 3610 Å, with a FWHM of 38 Å. Deep level emission at 5500 Å is noticeably absent from the room temperature PL, indicative of high purity material.

In general, the characteristics of GaN grown by HVPE are comparable to high quality GaN grown by any other method.

The advantage of HVPE is that very thick layers can be grown without cracking. Using HVPE, GaN may be readily grown on sapphire to thicknesses of greater than 15 microns without epi-layer cracking, and growth conditions and initiation conditions may be selected without undue experimentation to permit the HVPE growth of crack-free GaN base layers of even greater thickness.

In general, the GaN base layer of the present invention may be formed by HVPE growth at any suitable thickness, appropriate to the microelectronic device fabrication or other end use application of such base layer. For example, the GaN base layer may be grown at a thickness of at least about 2 microns. More generally, the GaN layer may be formed with a thickness in the range of from about 0.5 micron to about 1000 microns, preferably from about 2 microns to about 50 microns, more preferably from about 2 microns to about 25 microns, and most preferably from about 5 microns to about 20 microns. In such ranges, the lower limit is typically dictated by the achievement of low defect density, and the upper limit is dictated by avoidance of base layer cracking and bowing, as well as process time constraints.

The HVPE GaN base layers formed in accordance with the present invention may be usefully employed for subsequent bulk growth of GaN thereon by metalorganic chemical vapor deposition (MOCVD), molecular-beam epitaxy (MBE), or by any other suitable deposition techniques.

The devices which may be formed on the base layer in the broad practice of the invention may comprise any suitable device structure, including, but not limited to, devices such as light emitting diodes, detectors, filters, transistors, rectification circuitry, and semiconductor lasers. It will be recognized that the base layer of the present invention provides a formation surface which is readily amenable as a foundation structure for the fabrication of a wide variety of devices and precursor device structures on such base layer.

The features and advantages of HVPE (Ga, Al, In)N base layer formation and implementation in accordance with the present invention are more fully illustrated by the following examples.

EXAMPLE 1

MOCVD Growth of GaN on a Thick HVPE GaN Base Layer

The growth of high quality undoped, n-type and p-type GaN by MOCVD was demonstrated on HVPE GaN base layers. The HVPE layers were initially cleaned in methanol, loaded into an MOCVD reactor and heated directly to 1100° C. in an $H_2/NH_3$ ambient gas environment. Trimethylgallium was then added to the gas stream to initiate the growth of GaN. This process is significantly simpler than that required to grow GaN by MOCVD directly on sapphire, as described below.

The direct MOCVD growth of GaN on sapphire (without the HVPE base layer) is normally performed using a two-step process, in which a thin (<500 Å) GaN or AlN nucleation layer is initially grown on sapphire at low temperature (~500° C.) in a first step prior to heating to 1100° C. for the second step growth of GaN. The use of a HVPE GaN base layer eliminates the need for the first low temperature step which requires very tight tolerances and thereby use of the HVPE base layer substantially simplifies the growth process.

Figure 11:
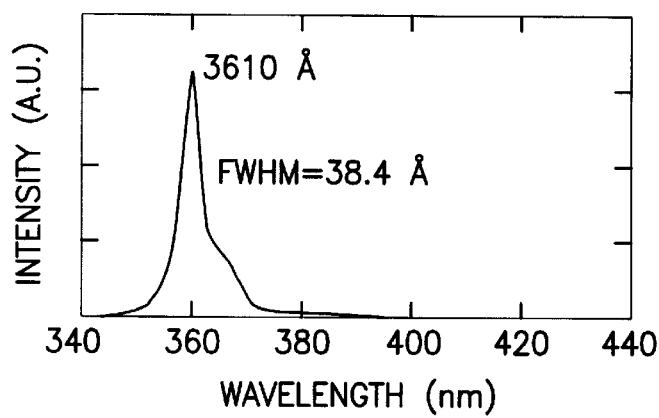
FIG. 11 is a room temperature photoluminescence spectrum of a GaN sample grown on (0001) sapphire by HVPE.

A 3 microns thick undoped GaN layer was grown by MOCVD on a HVPE GaN base layer of 12 microns thickness on sapphire. The structural, electrical and optical properties of the HVPE GaN base and the undoped MOCVD GaN layer grown on top of it are compared in Table 1 below. The x-ray FWHM was reduced by MOCVD growth, as compared to the original HVPE base layer. The HVPE GaN base layer has a background n-type carrier concentration of $1E18$ $cm^{-3}$ while the MOCVD GaN grown on top of it exhibited a high resistivity. The reduced GaN photoluminescence (PL) peak width for the MOCVD material (FIG. 11) corresponded to lower doping in this layer compared to the HVPE base layer. The surface of the MOCVD GaN layer exhibited a reduced roughness, compared to the initial HVPE base layer surface, as shown in FIGS. 12 and 13.

Figure 12:
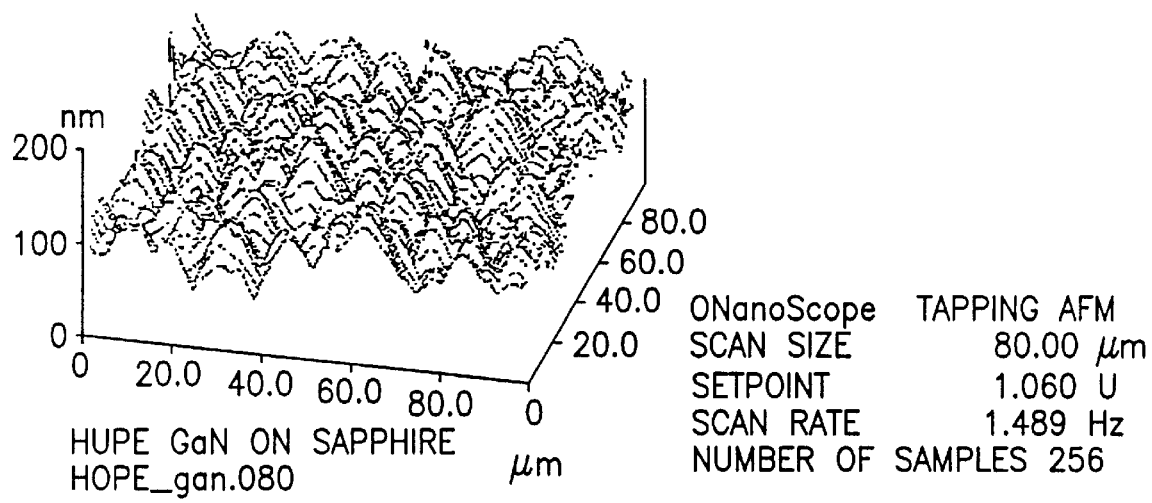
FIG. 12 is an atomic force microscope image of an 80 micron by 80 micron area on a HVPE GaN base layer on sapphire wafer chosen to intentionally show a rougher than optimal surface morphology of a HVPE GaN base layer before growth of MOCVD GaN thereon.
Figure 13:
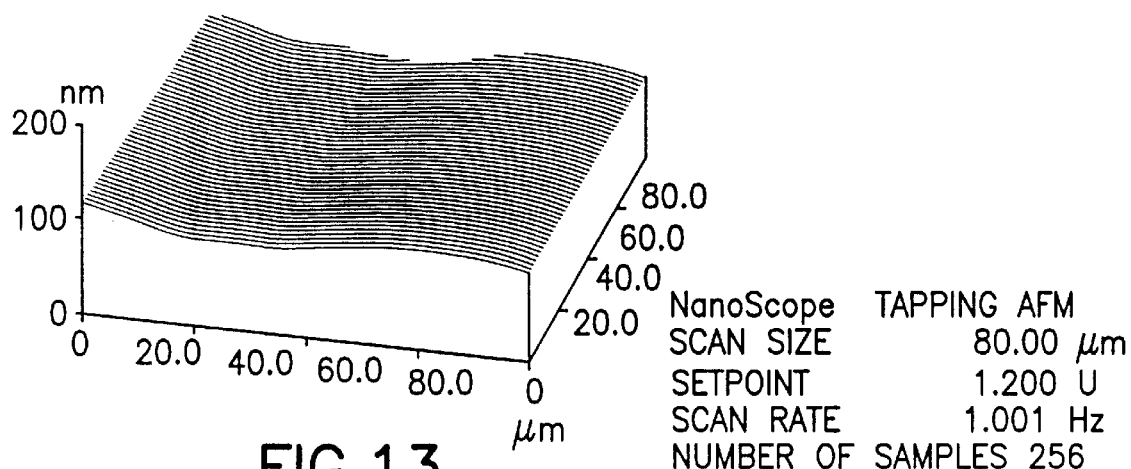
FIG. 13 is an atomic force microscope image of an 80 micron by 80 micron area of the wafer shown in FIG. 11 after the surface has been smoothed by 3 microns of MOCVD GaN growth.

FIG. 12 is an atomic force microscope image of an area on a wafer chosen to intentionally show a rougher than optimal surface morphology of a HVPE GaN base layer before growth of MOCVD GaN thereon. FIG. 13 is a atomic force microscope image of the same wafer showing the surface of MOCVD GaN after 3 microns of growth. The surface roughness of the material is significantly reduced after MOCVD growth, as shown in the FIG. 12 micrograph and quantitatively indicated by a reduction in the RMS surface roughness from 77 nm on the HVPE base layer area shown to 14 nm on the MOCVD film grown thereon. MOCVD-grown GaN on HVPE base layers are smooth, as is necessary for good quality.

|  | HVPE GaN | MOCVD GaN |
|---|---|---|
| Thickness | 12 μm | 3 μm |
| XRD FWHM | 286 arcsec | 196 arcsec |
| Carrier Concentration | n = 1E18 $cm^{-3}$ | high resistivity |
| 362 nm PL width (300K) | 45 meV | 32 meV |
| RMS surface roughness | 77 nm | 14 nm |

EXAMPLE 2

Devices Utilizing Thick HVPE GaN Base Layers

Thick HVPE GaN base layers of the present invention could be utilized in a number of optical and electrical devices to enhance lateral transport, improve heat dissipation from the active region and decrease the density of defects in the active region. Examples of these devices include laser diodes (e.g., FIG. 14), LEDs (e.g., FIGS. 3 and 16), detectors (e.g., FIGS. 20 and 21), bipolar transistors, permeable base transistors (e.g., FIG. 15), high electron mobility transistors (HEMTs) (e.g., FIG. 19) and vertical MISFETs.

Figure 14:
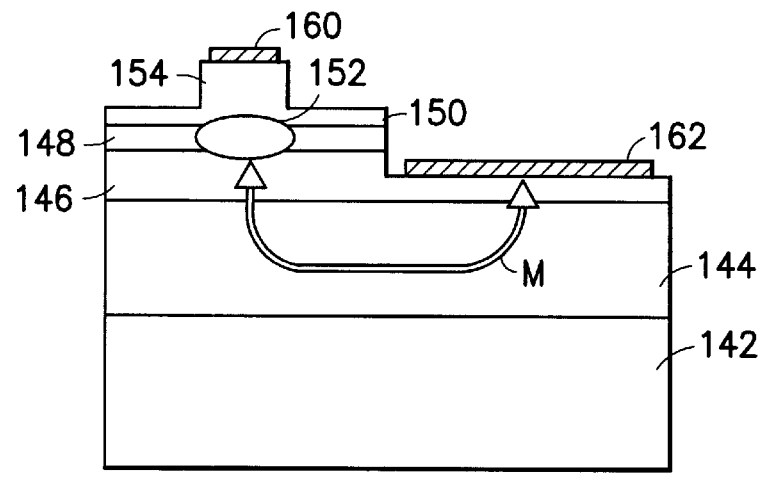
FIG. 14 is a schematic representation of a semiconductor laser device, with a thick GaN HVPE current spreading layer.

FIG. 14 is a schematic representation of a semiconductor laser device 140 in cross-sectional view with a thick GaN HVPE current spreading and heat dissipation layer 144. The laser device 140 comprises a substrate 142, e.g., an insulating substrate, on which is deposited an n-type GaN HVPE base layer 144. Overlying the base layer is an n-type GaN layer 146, an (InGa)N active region 148, and a p-type GaN layer 150 which has been etched or otherwise deposited to form a pedestal 154 for enhanced current confinement. A p-type contact layer 160 is formed on the upper surface of the pedestal 154. On the right-hand portion of the n-type GaN layer 146 as shown, there is provided an n-type contact layer 162, providing the current path M as illustrated, between the n-type contact layer 162 and the laser mode region 152 of the device. By virtue of the added thickness and conductance of the thick HVPE base layer 144 in the case of this semiconductor laser device, the series resistance between the n-type contact 162 and the p-type contact layer 160 is reduced and less heat is generated. Additionally, the heat generated in the active region 152 is more quickly dissipated by the thick base layer as compared to the same structure without the base layer. In addition, cleaving to form the edge-emitting facets (shown in the cross-section view of FIG. 14) is made easier by the thickness of the HVPE base layer. Formation of this facet by etching is also made easier by removing the active region further from the foreign substrate with the thick HVPE base layer.

Figure 15:
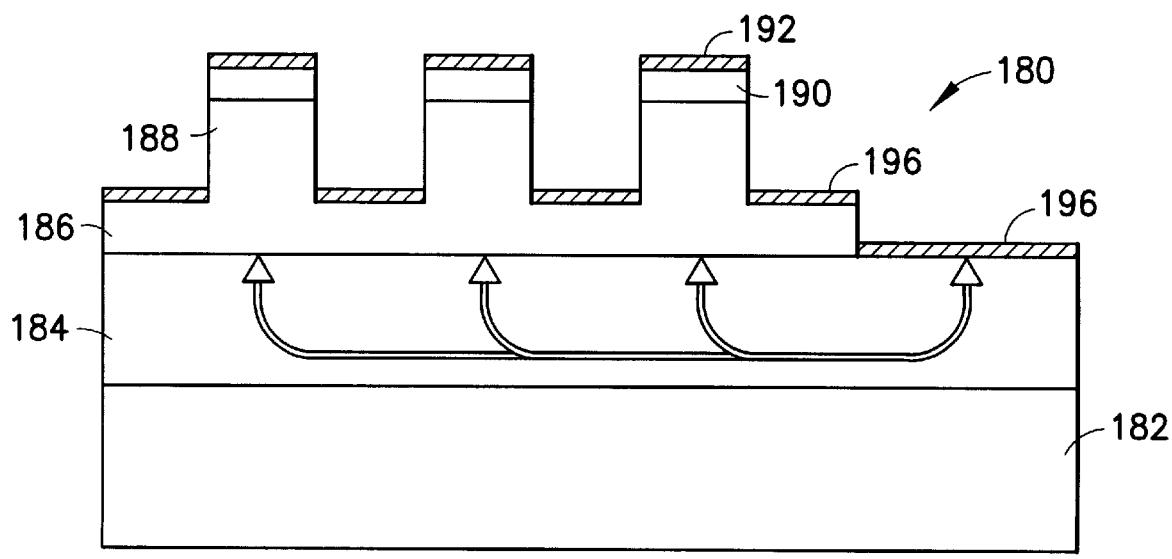
FIG. 15 is a schematic representation of a permeable base transistor (PBT) utilizing a thick GaN HVPE current spreading layer.

FIG. 15 is a schematic representation of a permeable base transistor (PBT) device 180 utilizing a thick GaN HVPE base layer 184 for enhanced lateral conduction and improved heat dissipation. The device 180 includes an insulating substrate 182 on which is formed the GaN HVPE base layer 184 having the drain electrode layer 196 on the right-hand portion thereof in the view shown. On the main surface portion of such base layer is formed a GaN layer 186 including upstanding columnar elements 188, on the upper portions of which are formed a highly conductive GaN layer 190 overlaid by the source electrode layer 192. A gate electrode layer 194 is deposited on the lower main surface of GaN layer 186. Because of the insulating nature of the substrate in this structure, the thick base layer 184 must act as the drain for all the devices and an extended current path N between the drain electrode layer 196 and the source electrode layer 192 must be provided. A very thick HVPE base layer 184 reduces the resistance and enhances lateral carrier transport for effective implementation of this device structure. In addition, the thick base layer acts to dissipate heat from the device.

Figure 19:
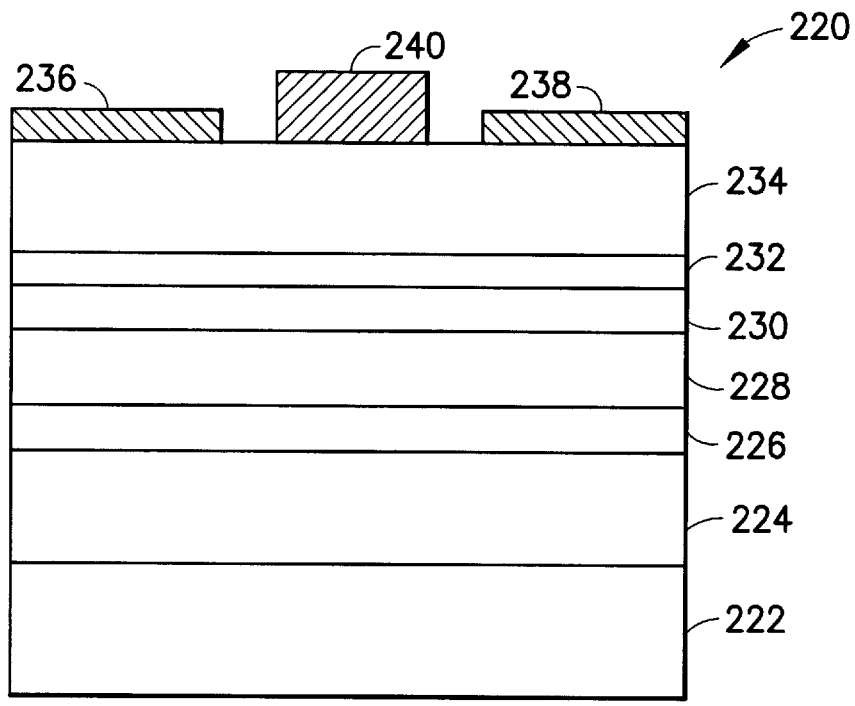
FIG. 19 is a schematic representation of a GaN/AlGaN HEMT device, comprising a GaN HVPE base layer according to the present invention.

FIG. 19 is a schematic representation of a GaN/AlGaN high energy electron mobility transistor (HEMT) device 220 including a semi-insulating HVPE GaN base layer for improved electrical isolation. The thick HVPE GaN base layer is also beneficial for heat dissipation in this device.

The device 220 comprises a substrate 222, e.g., of sapphire, on which is formed a GaN HVPE base layer 224. A GaN layer 226 is formed on the base layer, and has an undoped AlGaN layer 228 formed thereon. A GaN layer 230 is deposited on the undoped AlGaN layer 230, and is overlaid by a layer of undoped AlGaN 232. A top n-type AlGaN layer 234 has source electrode 236, drain electrode 238 and gate electrode 240 formed thereon as shown. The two dimensional electron gases responsible for the high electron mobility of this type device is formed in the undoped GaN layer 230, at the interface with the AlGaN layers 232 and 228. The base layer 224 in this device is semi-insulating to isolate adjacent devices. The added thickness of the base layer 224 enhances the removal of heat, as described for previous devices. In addition, the low defect density of the thick HVPE base layer, enables fewer defects in the 2 dimensional gas as compared to this device without the base layer 224, thus enhancing the electron mobility and improving the performance of this device.

Figure 20:
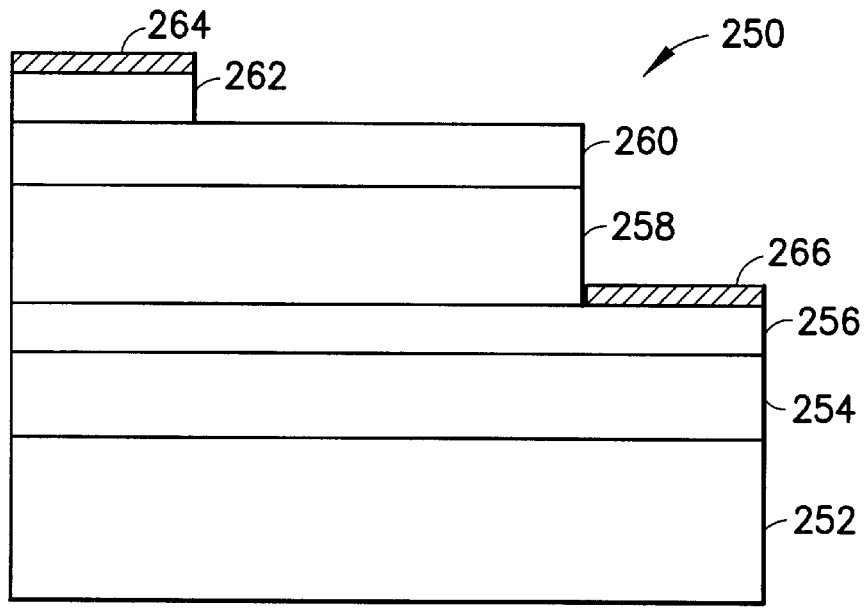
FIG. 20 is a schematic representation of an AlGaN photodiode comprising a GaN HVPE base layer according to the present invention.

In another illustrative device structure utilizing a base layer architecture in accordance with the present invention, a photodiode device 250 is shown in FIG. 20. The photodiode device 250 is formed on a substrate 252, e.g., of sapphire, having an HVPE GaN or AlGaN base layer 254 formed thereon. An n-type GaN layer 256 is formed on the base layer, and overlaid by an n-type AlGaN layer 258. On the n-type AlGaN layer 258 is deposited a p-type AlGaN layer 260. A p-type GaN layer 262 is formed on the AlGaN layer 260, in the form of a pedestal element, on which is deposited a p-type metal contact layer 264. A n-type metal contact layer 266 is provided on n-type GaN layer 256, to complete the structure of this AlGaN photodiode device. The composition of the thick base layer 254 and in the n-type AlGaN 258 and p-type AlGaN 260 are chosen to be the same and to match the wavelength that is desired to be detected. By using a thick base layer matching the composition of the AlGaN layers 254, 258 and 260, strain is reduced, defect density is reduced and the noise level in this detector is reduced. Thus the sensitivity of this photodiode detector is enhanced by the thick lattice-matched HVPE base layer.

Figure 21:
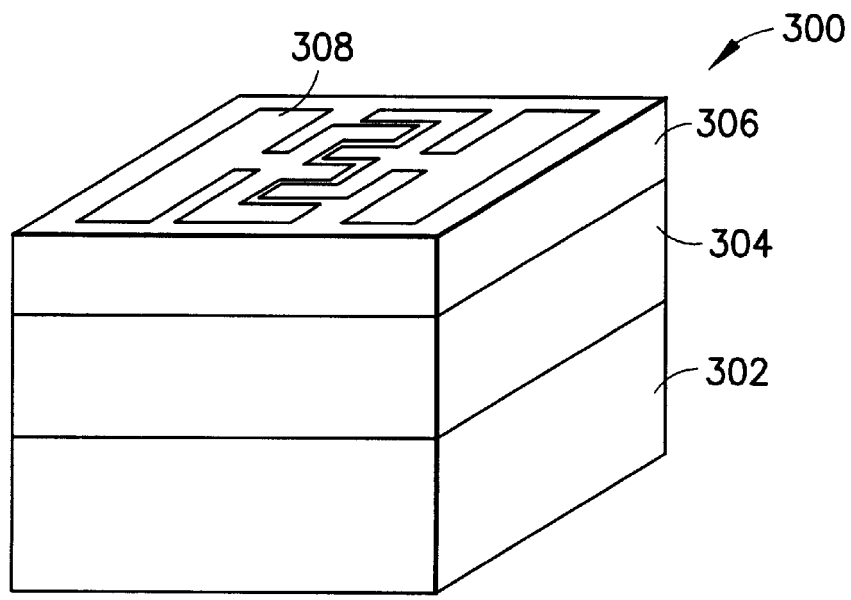
FIG. 21 is a perspective schematic view of a GaN photoconductive detector, comprising an (AlGaIn)N HVPE base layer according to the invention.

As a still further embodiment of the invention, FIG. 21 is a perspective schematic representation of a GaN photoconductive detector 300 constructed in accordance with the present invention. The device 300 comprises a substrate 302, having a (AlGaIn)N HVPE base layer 304 thereon. Formed on the base layer is a (AlGaIn)N layer 306, on the upper surface of which is fabricated the detector photoconductive elements 308. As with the photodiode, the composition of the AlGaInN layers 304 and 306 are chosen to be the same and to match the wavelength that is desired to be detected. In this way the detection wavelength can be varied and the defects, strain and noise are reduced to enhance detector sensitivity.

The advantages of HVPE GaN base layers are illustrated by improved performance of UV photoconductive detectors fabricated on them. Solar-blind UV photodetectors have a number of applications including missile detection, flame sensing, and solar UV monitoring. The III-V nitrides are ideal for these applications due to their wide bandgaps, making detectors transparent to visible and infrared radiation.

Photoconductive detectors were fabricated and compared on sapphire substrates as well as HVPE GaN-on-sapphire substrates, by forming interdigitated electrodes using standard photolithography, metallization and lift-off procedures. The structure consisted of a 3 $\mu$m thick highly resistive (>$10^5$ $\Omega$-cm) GaN layer that was grown by MOCVD on the two substrates. The Ti/Al electrodes were 5 $\mu$m wide with 10 $\mu$m spacing. The square detector dimension was 1 mm on a side.

Figure 23:
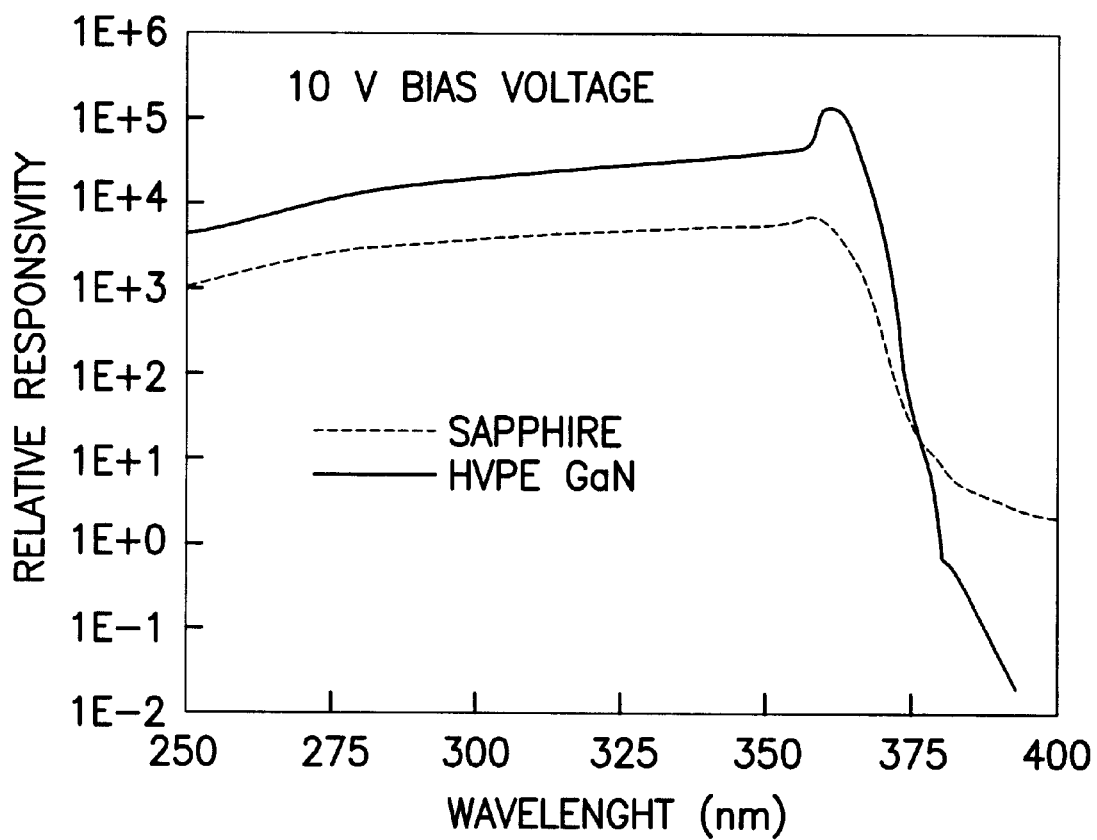
FIG. 23 is a graph of the relative responsivity as a function of wavelength for GaN photoconductive detectors fabricated both on sapphire and HVPE GaN substrates.

FIG. 23 is a plot of the relative responsivity as a function of wavelength for such a detector on both sapphire and HVPE GaN substrates. The detector on the HVPE GaN substrate showed both a larger responsivity and sharper wavelength cutoff than an identical device on sapphire (both of these characteristics are more desirable for UV detectors). The improved device performance is attributed to the higher quality GaN layer grown on the low defect density HVPE GaN base layer as compared to directly on sapphire.

EXAMPLE 3

Use of Thick HVPE (Ga, Al, In)N Base Layers to Simplify the Growth of Device Structures and Improve Device Characteristics HVPE GaN base layers grown on (0001) sapphire were evaluated as a substrate material for (Ga, Al, In) optical devices grown by MOCVD.

Figure 16:
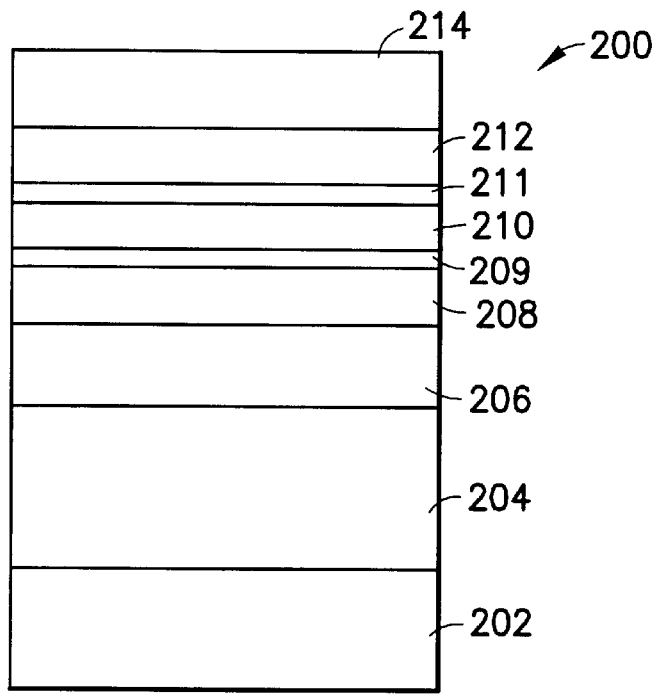
FIG. 16 is a schematic representation of a laser diode (LD) or light-emitting diode (LED) structure formed on a foundation including a HVPE GaN base layer and sapphire substrate, constituting an edge emitting laser structure with an InGaN/GaN multiple quantum well (MQW) active region, AlGaN cladding layers, a GaN:Si n-type layer, and a GaN:Mg p-type capping layer, together with a low indium composition InGaN crack reducing layer.

FIG. 16 is a schematic of a laser diode (LD)/light-emitting diode (LED) structure 200 including a 10 microns thick HVPE GaN base layer 204 on a sapphire substrate 202. The structure constitutes an edge emitting laser structure including an InGaN/GaN molecular quantum well (MQW) active region 210 comprising, for example, 5–10 quantum wells (QWs), AlGaN cladding layers 208 and 212 at the bottom and top surfaces of the MQW active region, respectively, a GaN:Si n-type layer 206, and a GaN:Mg p-type capping layer 214. In addition, low indium composition InGaN layers 209 and 211 were employed between the MQW active region and the adjacent cladding layers.

Figure 17:
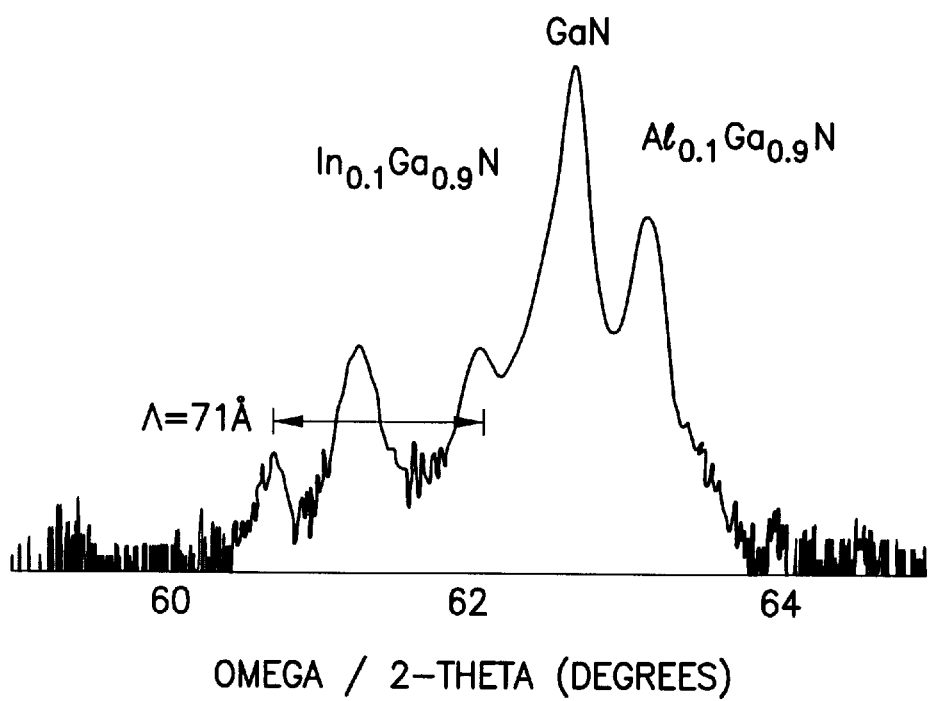
FIG. 17 is an x-ray diffraction scan for the AlInGaN MQW LED structure of FIG. 16.

X-ray diffraction was measured for this structure, yielding the x-ray diffraction scan shown in FIG. 17. Peaks from all of the growth layers were observed, including the satellite peaks associated with the InGaN/GaN superlattice of the active region. The ability to observe x-ray diffraction from the superlattice is indicative of very high crystal quality and very smooth and uniformly spaced interfaces. The periodicity of the InGaN/GaN MQW was 71 Å. Thus, the HVPE GaN base layers permitted very smooth and high quality (Ga, Al, In)N overgrowth by MOCVD.

Figure 18:
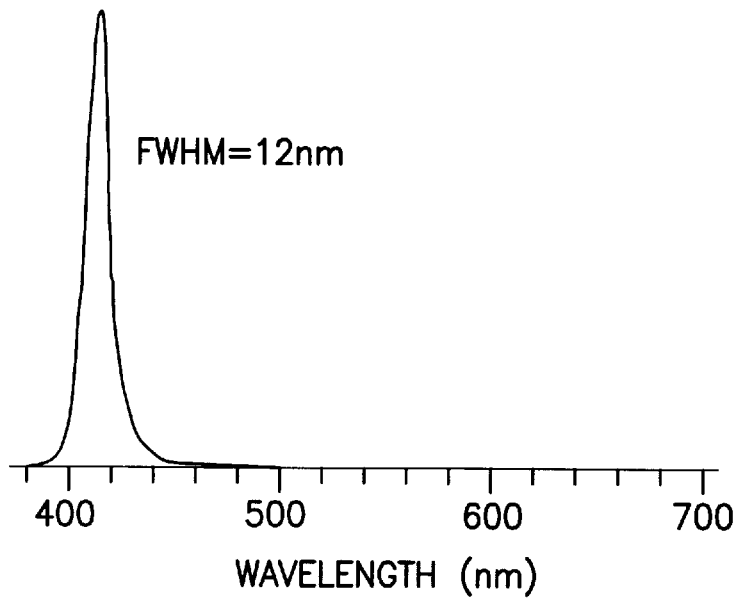
FIG. 18 is a room temperature electroluminescence spectrum for the LED fabricated from the structure of FIG. 16; the LED is operated at 10 mA.

This structure was fabricated into LEDs. The electroluminescence spectrum obtained from this device when operated at 10 mA is shown in FIG. 18. Most notably, the emission spectrum is dominated by the near bandgap peak at ~410 nm. The FWHM of this peak (12 nm) is very low and is lower than the sub-threshold peak width of lasers reported in S. Nakamura, M. Senoh, S. Nagamama, N. Iwasa, T. Yamada, T. Matsushita, H. Kiyoku and Y. Sugimoto, Appl. Phys. Lett. 68 (1996) 3269, which is the lowest reported value of which we are aware. In addition, blue LEDs (emitting at 470 nm) had an external quantum efficiency of 10.6% at 20 mA and 8.7% at 100 mA. Green LEDs (emitting at 522 nm) had an external quantum efficiency of 4.5% at 20 mA. These devices have efficiencies as high as the best LEDs published to date (S. D. Lester, M. J. Ludowise, K. P. Killeen, B. H. Perez, J. N. Miller, and S. J. Rosner, Proceeding of the Second International Conference on Nitride Semiconductors, (1997) 510). Thus, the HVPE GaN base layer permitted the growth of high quality LEDs, with improved optical purity and quantum efficiency relative to the state of the art.

EXAMPLE 4
High Quality thick InGaN wells enabled by high quality base layers

This Example illustrates the use of GaN base layers deposited by HVPE on sapphire for application in optoelectronic devices.

A double-heterostructure (DH) optically pumped laser with cleaved facets was demonstrated for the first time for InGaN/GaN. The structure consists of a 1000 Å thick InGaN layer sandwiched between two 2200 Å GaN layers grown by MOVPE on a 10 micron GaN base layer on sapphire. The input power density threshold for lasing was 1.3 MW/cm$^2$, and the produced laser emission linewidth was 13.5 meV. Above threshold, the differential quantum efficiency increased by a factor of 34, and the output became highly polarized with a TE/TM ratio of 100.

Several facts highlight the advantages of growing these structures on HVPE base layers. Firstly, the use of the thick base layers allowed or eased cleaving of the sapphire substrate without introducing damage to the active region. The HVPE base structure below the active region is key to producing smooth cleaved facets in laser structures. Secondly, the HVPE base layer enabled smooth interfaces. Thirdly, the reduced defect density in the active region of the device increases carrier lifetime which is important for laser performance.

The present invention permits the fabrication of a (Ga, Al, In) nitride growth layer, and enables devices on foreign (poor lattice match) materials to be readily achieved, by the provision of thick HVPE-grown (Ga, Al, In)N base layers. In addition, the present invention provides the ability to introduce intentional impurities to produce n-type, p-type and semi-insulating HVPE base layers.

The present invention achieves a substantial advance in the art and is distinguishable from the approaches and structures of the prior art, as addressed more fully below in reference to the teachings of various patents, whose teachings are summarized below.

U.S. Pat. No. 5,290,393 issued Mar. 1, 1994 to S. Nakamura discloses a (Al, Ga)N nucleation layer on sapphire, grown at temperatures below 900° C. and at thicknesses less than 100 Angstroms. Also, the aforementioned U.S. Pat. No. 5,385,562 issued Jan. 31, 1995 to T. D. Moustakas discloses a GaN nucleation layer on sapphire, grown at temperatures between 100 and 400° C. and at thicknesses less than 100 Angstroms. Similarly, the aforementioned Jap. Patent 60-256806 to Akasaki discloses an AlN nucleation layer on sapphire, grown at temperatures near 600° C. to thicknesses of approximately 100 Angstroms. U.S. Pat. No. 5,393,993 issued Feb. 28, 1995 to J. A. Edmond, et al. describes a transition crystal structure between GaN and SiC, consisting of two or three individual layers of AlGAN with individual layers only on the order of 1000 Å thick, in which the dislocation density is typically 1E8-1E9 cm$^{-2}$. U.S. Pat. No. 5,523,589 issued Jun. 4, 1996 to J. A. Edmond et al. describes a vertical LED device on an SiC substrate which may include a conductive AlGaInN buffer layer. Each of the Nakamura patent, Moustakas patent, and Akasaki patent disclose a nucleation layer which has a dislocation density believed to be in excess of 1E11 cm$^{-2}$ and yielding GaN layers grown on the nucleation layers with dislocation density in excess of 1E9 cm$^{-2}$ and more commonly in excess of 1E10 cm$^{-2}$.

Figure 6:
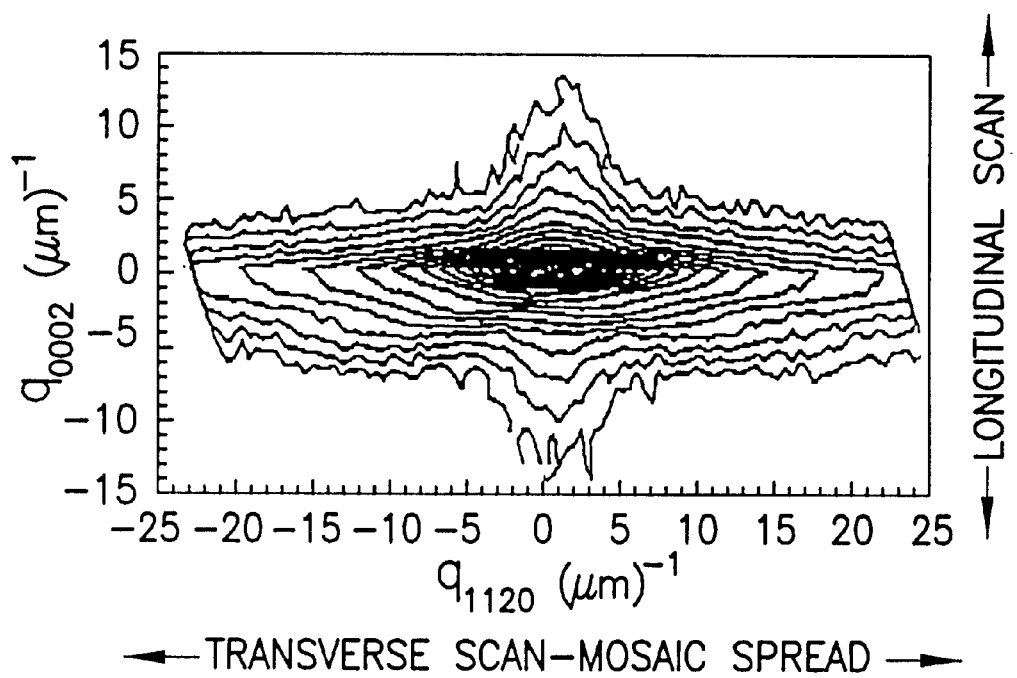
FIG. 6 is a high resolution triple-crystal x-ray diffraction spectrum of HVPE GaN grown on sapphire, in a reciprocal space map.

The thick HVPE (Ga, Al, In)N base layers of the present invention are distinguishable from those of the Nakamura patent, the Moustakas patent, the Akasaki patent and the Edmond et al. patents in that the HVPE base layers of the present invention:

(1) are typically thicker, being able to be grown in excess of 0.5 micron thickness, e.g., with a thickness in the range of from about 0.5 micron to about 1000 microns, preferably from about 2 microns to about 50 microns, more preferably from about 2 microns to about 25 microns, and most preferably from about 5 microns to about 20 microns;

(2) are usefully grown at temperatures between about 900 and about 1200° C., and preferably from about 1000 to about 1100° C.;

(3) can also contain In for base layers for In-containing device structures;

(4) can also be doped n-type, p-type, or semi-insulating;

(5) are characterized by a low dislocation density, less than 1E9 cm$^{-2}$ and typically less than 1E8 cm$^{-2}$;

(6) permit the growth of very strain-relaxed epilayers, as shown for example by the reciprocal space x-ray diffraction map of FIG. 6 herein; and (7) have lower overall resistance for higher electrical and thermal conductance of lateral devices on insulating substrates due to the increased thickness of the HVPE base layers compared to the nucleation layers achievable with the processes of the Nakamura patent, Moustakas patent, and Akasaki patent.

The present invention provides all of the foregoing advantages. Such combination of advantages is not taught or suggested by the prior art.

Accordingly, the HVPE base layers of the present invention have substantial advantages over conventional nucleation layers. The thermal conductivity of thick HVPE base layers of the present invention is superior to the thermal conductivity of conventional nucleation layers. By using thick HVPE base layers, e.g., in excess of 5 microns, and more preferably 10 microns in thickness, in accordance with the present invention, heat generated within the active region of resultingly fabricated devices is more efficiently removed from such devices. Thermal management of the generated heat of the device therefore is facilitated by the thickness of the HVPE base layers of the present invention.

A further advantage of using thick HVPE base layers in accordance with the present invention is that they facilitate cleaving of GaN devices on foreign substrates. For thicker (Ga, Al, In)N bases/devices, the cleavage planes of the (Ga, Al, In)N will be more readily retained upon cleaving. Alternatively, for layers with polished facets, the thicker base layer, moves the active region of semiconductor diode devices further from the substrate.

Thus, HVPE base layers and devices comprising same afford substantial advantages relative to present device structures of the art. The thermal conductivity advantages of HVPE base layers permit acceptable operating temperature conditions to be achieved in high current devices such as lasers, and permit such base layers to be usefully employed in various high temperature operation electronic devices. The thickness of HVPE base layers of the present invention may be widely varied in device and end use applications, e.g., in the range of from about 0.5 micron to about 1,000 microns. The strain-relaxed characteristics of such HVPE base layers are superior to base layers of the prior art, and low sheet resistance is achieved by HVPE base layers of the present invention. Further, such HVPE base layers can be grown at temperatures on the order of about 650 to about 1,400° C. (depending on base layer and substrate composition), and such layers may be doped selectively, to achieve n-type, p-type or semi-insulating character, for use in specific electronic device applications. The aforementioned Nakamura patent, Moustakas patent and Akasald patent, by contrast, all describe a nucleation layer having a thickness less than 0.5 micron, which is grown at temperatures below 900° C. The HVPE base layers of the present invention also afford substantial cleavability advantages, and smoother surfaces, relative to nucleation layers of the prior art.

The (Ga, Al, In)N base layer may be initially formed on a substrate, and the substrate may be removed to provide a free-standing (Ga, Al, In)N article. The free-standing (Ga, Al, In)N article may then serve as an independent base substrate for device fabrication.

Such removal of the initially employed substrate from the (Ga, Al, In)N base layer may be carried out in any suitable manner, either in situ or ex situ, by any suitable means and/or method, such as chemical and/or mechanical removal techniques.

The substrate upon which the HVPE base layer(s) are deposited can be tailored to enhance the properties of the base layer(s). For instance, differences in the thermal coefficient of expansion for a base layer and a substrate can cause cracking and bowing upon cool-down after growth. Thus, by using substrates with the same thermal coefficient of expansion as the base layer, cracking and bowing are minimized. Since intermediate layers can be placed upon the substrate, the substrate is not required to be single crystal. As mentioned, the substrate material can be chosen so that it can be easily removed in situ or ex situ. The substrate may also be chosen to have similar (i.e., within ±25%) thermal coefficient of expansion to the base layer of (Ga, Al, In) nitride. Such thermal coefficient of expansion-matched substrate can be a single crystal material, or alternatively a polycrystalline material.

Further, it may be desirable in the broad practice of the present invention to provide one or more interlayers between the substrate and (Ga, Al, In)N base layer(s), to protect the substrate and the base layer from adverse effects during fabrication. The interlayers are also employed to control the growth nucleation, structural properties or electrical properties of the (Ga, Al, In)N base layer.

While the invention has been described herein with respect to specific features, embodiments and aspects, it would be appreciated that the invention is not thus limited, and contemplates other variations, modifications and embodiments. Accordingly, the invention as hereafter claimed is to be broadly construed, to encompass all such variations, modifications and alternative embodiments, within its spirit and scope.

What is claimed is:

1. A method of forming a base structure for fabrication of a microelectronic device structure thereon, comprising reacting a vapor-phase (Ga, Al, In) composition with a vapor-phase nitrogenous compound in the presence of a substrate, to grow a (Ga, Al, In) nitride base layer on the substrate, thereby yielding a microelectronic device foundation comprising the substrate with the (Ga, Al, In) nitride base layer thereon.

2. A method according to claim 1, wherein the vapor-phase (Ga, Al, In) composition comprises (Ga, Al, In) chloride or (Ga, Al, In) bromide.

3. A method according to claim 1, wherein the base layer of (Ga, Al, In) nitride comprises a single-crystal, crack-free base layer of (Ga, Al, In) nitride.

4. A method according to claim 1, wherein the base layer of (Ga, Al, In) nitride has a defect density not greater than about 1E8 defects/cm$^2$.

5. A method according to claim 1, wherein the base layer of (Ga, Al, In) nitride has a defect density not greater than about 1E7 defects/cm$^2$.

6. A method according to claim 1, wherein the thickness of the base layer is at least about 2 microns.

7. A method according to claim 1, wherein the base layer is formed of a material selected from the group consisting of GaN, AlN, and InN.

8. A method according to claim 1, wherein the base layer is formed of a material selected from the group consisting of GaAlN, GaInN, and AlInN.

9. A method according to claim 1, wherein the base layer is formed of a material comprising GaAlInN.

10. A method according to claim 1, wherein the base layer is formed of a material comprising GaN.

11. A method according to claim 1, wherein the base layer is formed of a material comprising AlN.

12. A method according to claim 1, wherein the base layer is formed of a material comprising InN.

13. A method according to claim 1; wherein the substrate comprises a single crystal material.

14. A method according to claim 1, wherein the substrate comprises a polycrystalline material.

15. A method according to claim 1, wherein the substrate comprises a material that is matched in thermal coefficient of expansion to the base layer of (Ga, Al, In) nitride.

16. A method according to claim 1, wherein the substrate is formed of a material selected from the group consisting of sapphire, silicon, silicon carbide, diamond, lithium gallate, lithium aluminate, ScAlMgO$_4$, zinc oxide, spinel, magnesium oxide, gallium arsenide, glass, silicon-on-insulator, carbonized silicon-on-insulator, carbonized silicon-on-silicon and gallium nitride.

17. A method according to claim 1, wherein the substrate comprises sapphire.

18. A method according to claim 1, wherein the substrate comprises graphite and aluminum nitride.

19. A method according to claim 1, further comprising removing the substrate from the base layer.

20. A method according to claim 19, wherein the substrate is removed from base layer by chemical and/or mechanical process.

21. A method according to claim 1, wherein the substrate is selected from the group consisting of conductive substrates, insulating substrates, semi-insulating substrates, twist-bonded substrates, compliant substrates, and patterned substrates.

22. A method according to claim 1, wherein the layer of single crystal (Ga, Al, In)N is deposited directly on the surface of the substrate.

23. A method according to claim 1, wherein the layer of single crystal (Ga, Al, In)N is deposited on an uppermost surface of one or more intermediate layers which in turn are provided on the substrate.

24. A method according to claim 1, wherein an intermediate layer is provided between the substrate and the base layer, and the intermediate layer comprises a material other than ZnO.

25. A method according to claim 1, wherein an intermediate layer is provided between the substrate and the base layer, and the intermediate layer comprises a material selected from the group consisting of SiC, (Ga, Al, In)N, and alloys of ZnO, SiC and (Ga, Al, In)N.

26. A method according to claim 1, wherein an intermediate layer is provided between the substrate and the base layer, and the intermediate layer comprises a material selected from the group consisting of SiC, (Ga, Al, In)N, and alloys of SiC and (Ga, Al, In)N.

27. A method according to claim 1, wherein the substrate is formed of a material selected from the group consisting of sapphire, silicon, and silicon carbide.

28. A method according to claim 1, wherein the substrate is selected from the group consisting of conductive substrates, insulating substrates, and semi-insulating substrates.

29. A method according to claim 1, wherein the layer of single crystal (Ga, Al, In)N is deposited directly on the surface of the substrate.

30. A method according to claim 1, wherein the layer of single crystal (Ga, Al, In)N is deposited on an uppermost surface of one or more intermediate layers which in turn are provided on the crystalline substrate.

31. A method according to claims 30, wherein the one or more intermediate layers is comprised of a material selected from the group consisting of ZnO, SiC, (Ga, Al, In)N, and alloys of SiC and (Ga, Al, In)N.

32. A method according to claim 30, wherein the one or more intermediate layers is comprised of a material selected from the group consisting of SiC, (Ga, Al, In)N, and alloys of SiC and (Ga, Al, In)N.

33. A method according to claim 30, wherein the one or more intermediate layers is comprised of a material other than ZnO.

34. A method according to claim 30, wherein the one or more intermediate layers comprise a protective layer provided thereon prior to growth of the (Ga, Al, In)N base layer, so that the protective layer prevents decomposition of the substrate while (Ga, Al, In)N base layer growth is proceeding.

35. A method according to claim 30, wherein the one or more intermediate layers modify the electrical properties of the (Ga, Al, In)N base structure, as compared to a corresponding structure lacking such intermediate layers.

36. A method according to claim 35, wherein the one or more intermediate layers increase the conductivity of the (Ga, Al, In)N base structure, as compared to a corresponding structure lacking such intermediate layers.

37. A method according to claim 35, wherein the one or more intermediate layers decrease the conductivity of the (Ga, Al, In)N base structure, as compared to a corresponding structure lacking such intermediate layers.

38. A method according to claim 1, wherein the thickness of the base layer is from about 0.5 microns to about 1000 microns.

39. A method according to claim 1, wherein the thickness of the base layer is from about 2 microns to about 25 microns.

40. A method according to claim 1, wherein the thickness of the base layer is from about 5 microns to about 20 microns.

41. A method according to claim 1, having a light emitting diode fabricated thereon, said light emitting diode having a FWHM electroluminescence spectrum peak, below threshold current, of less than 15 nm.

42. A method according to claim 41, wherein the light emitting diode comprises an InGaN light emitting diode structure base layer.

43. A method according to claim 1, further comprising forming an epitaxial layer on the base structure wherein the epitaxial layer has a V-defect density less than 1E9.

44. A method according to claim 1, further comprising forming an epitaxial layer on the base structure wherein the epitaxal layer has a V-defect density less than 1E8.

45. A method according to claim 1, further comprising forming an epitaxial layer on the base structure wherein the epitaxial layer has a V-defect density less than 1E7.

46. A method according to claim 1, wherein the base layer is greater than 100 micrometers in thickness and has a defect density, measured on sapphire as a reference material, that is less than about 1E7 defects/cm$^2$ at the upper surface of the material.

47. A method according to claim 1, wherein the nitrogenous compound is selected from the group consisting of ammonia, hydrazine, amines, and polyamine.

48. A method according to claim 1, wherein said vapor-phase (Ga, Al, In) composition comprises Ga chloride.

49. A method according to claim 48, wherein the Ga chloride is formed by contacting vapor-phase hydrogen chloride with molten gallium to yield the vapor-phase Ga chloride.

50. A method according to claim 48, wherein the base layer is grown at a growth rate of at least 10 $\mu$m/hour.

51. A method according to claim 48, wherein the base layer is grown at a growth rate of at least 50 $\mu$m/hour.

52. A method according to claim 48, wherein the base layer is grown to produce a single-crystal, substantially crack-free base layer characterized by an upper surface region with a defect density of less than $10^8$ defects/cm$^3$.

53. A method according to claim 48, wherein the base layer is grown to produce a single-crystal, substantially crack-free base layer characterized by an upper surface region with a defect density of less than $10^7$ defects/cm$^3$.

54. A method according to claim 48, wherein the base layer comprises GaN and the growth temperature is from about 900 to about 1200° C.

55. A method according to claim 48, wherein the base layer comprises InN and the growth temperature is from about 650 to about 1000° C.

56. A method according to claim 48, wherein the base layer comprises AlN and the growth temperature is from about 900 to about 1400° C.

57. A method according to claim 48, wherein the base layer comprises GaN and the growth temperature is about 1050° C.

58. A method according to claim 48, wherein the base layer comprises GaN and the growth temperature is about 1000° C.

59. A method for fabrication of a microelectronic device, comprising reacting vapor-phase (Ga, Al, In) chloride with a vapor-phase nitrogenous compound in the presence of a substrate, to grow a (Ga, Al, In) nitride base layer on the substrate, thereby yielding a microelectronic device foundation comprising the substrate with the (Ga, Al, In) nitride base layer thereon, and subsequently forming a microelectronic device on the base layer.

60. A method according to claim 59, wherein the microelectronic device is formed on the base layer by a process including deposition of device layers by a deposition technique selected from the group consisting of metalorganic chemical vapor deposition (MOCVD) and molecular-beam epitaxy (MBE).

61. A method according to claim 59, wherein the microelectronic device is formed on the base layer by a process including at least one process step selected from the group consisting of ion implantation and etching.

62. A method according to claim 59, wherein the microelectronic device is selected from the group consisting of light emitting diodes, detectors, filters, transistors, rectification circuitry, and semiconductor lasers.

* * * * *

UNITED STATES PATENT AND TRADEMARK OFFICE
CERTIFICATE OF CORRECTION

PATENT NO. : 6,156,581  
DATED : December 5, 2000  
INVENTOR(S) : Robert P. Vaudo, Joan M. Redwing, Michael A. Tischler, Duncan W. Brown Page 1 of 1

It is certified that error appears in the above-identified patent and that said Letters Patent is hereby corrected as shown below:

Fig. 12 change "Setpoint 1.663 U" to -- Setpoint 1.060 U --.  
Fig. 12 change "Scan Rate 0.5003 Hz" to -- Scan Rate 1.489 Hz --.

Signed and Sealed this

Twenty-fifth Day of September, 2001

*Attest:*

NICHOLAS P. GODICI  
Acting Director of the United States Patent and Trademark Office

*Attesting Officer*